US006246408B1

(12) United States Patent
Alexander

(10) Patent No.: US 6,246,408 B1
(45) Date of Patent: *Jun. 12, 2001

(54) GRAPHICAL SYSTEM AND METHOD FOR INVOKING MEASUREMENTS IN A SIGNAL MEASUREMENT SYSTEM

(75) Inventor: Jay A Alexander, Monument, CO (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/275,283

(22) Filed: Mar. 24, 1999

Related U.S. Application Data

(63) Continuation of application No. 08/863,659, filed on May 27, 1997, now Pat. No. 5,953,009.

(51) Int. Cl.[7] .............................. G06F 3/00; G06F 3/14; G06F 17/00
(52) U.S. Cl. ........................ 345/348; 345/134; 345/440; 345/970; 702/68
(58) Field of Search ........................ 345/134, 348–349, 345/440, 970; 702/67, 68; 364/481, 483, 485, 487

(56) References Cited

U.S. PATENT DOCUMENTS

| 4,868,496 | 9/1989 | Havel ................................... 324/115 |
| 4,891,743 | 1/1990 | May et al. ............................ 363/87 |
| 5,129,722 | * 7/1992 | Mader et al. ........................ 345/134 |
| 5,247,287 | 9/1993 | Jonker et al. ........................ 345/134 |
| 5,579,462 | 11/1996 | Barber et al. ........................ 345/440 |
| 5,592,390 | 1/1997 | Liken et al. .......................... 702/67 |
| 5,724,974 | 3/1998 | Goodsell, Jr. et al. ......... 128/661.09 |
| 5,785,655 | 7/1998 | Goodsell, Jr. et al. ............... 600/441 |

OTHER PUBLICATIONS

John Novellino, "Scopes combine digital power with ease of use", Electronic Design, Jun. 1991, v.39, n12, p131(3).

(List continued on next page.)

Primary Examiner—Raymond J. Bayerl
Assistant Examiner—X. L. Bautista

(57) ABSTRACT

A system and methodology for use in a signal measurement system having a graphical user interface. The measurement invocation system is configured to provide graphical control elements on the graphical user interface such that the selection of a control element invokes a measurement operation on a selected displayed waveform. The measurement invocation system automatically performs a waveform measurement function when graphically associated by a user with a waveform displayed in a waveform display region of a graphical user interface is disclosed. The measurement invocation system includes a measurement toolbar manager configured to display on the graphical user interface one or more measurement icons. Each of the icons corresponds to a waveform measurement function. The toolbar manager identifies which of the one or more measurement icons has been selected by the user. A waveform identifier enables the user to graphically associate the selected measurement icon with a source waveform and determines a point of measurement invocation on the source waveform. The invocation system also includes a measurement controller that invokes the selected measurement function on a measurement extent of the source waveform when the association of the selected measurement and the source waveform is a valid association. Preferably, the measurement icons are arranged within a measurement toolbar region proximate to the waveform display region of the graphical user interface.

19 Claims, 13 Drawing Sheets

OTHER PUBLICATIONS

Stan Runyon, "Tek moves to extend lead in digital scopes", Electronic Engineering Times, Jun. 1991, n644, 1.

Joseph C. Panettieri, "Testing Starts On The New Windows", Informationweek, Dec. 1995, n559,PG18.

* cited by examiner

GRAPHICAL SYSTEM AND METHOD FOR INVOKING MEASUREMENTS IN A SIGNAL MEASUREMENT SYSTEM

RELATED APPLICATIONS

This application is a continuation of application Ser. No. 08/863,659, filed May 27, 1997, entitled GRAPHICAL SYSTEM AND METHOD FOR INVOKING MEASUREMENTS IN A SIGNAL MEASUREMENT SYSTEM, now U.S. Pat. No. 5,953,009.

BACKGROUND OF THE INVENTION

1. Field of the Invention

The present invention relates generally to signal measurement systems and, more particularly, to invoking measurements in signal measurement systems.

2. Related Art

Conventional signal measurement systems such as digital oscilloscopes sample, record and display time-varying analog signals. Samples of an input signal are taken and quantized, and the resultant digital representations are stored in a waveform memory under the control of a sampling clock. The acquired data may subsequently be read out as locations in memory are sequentially addressed by a clock signal to provide digital data which can be converted to a time-varying output signal for a waveform display. The sampling clock may be operated at one of several selectable rates depending upon the frequency content of the input signal. The selection of the portion of the analog input signal which is sampled and stored is determined by appropriate triggering circuitry to enable the operator to display the desired portion of the waveform.

There are many types of display elements which can be presented in signal measurement systems in general and test and measurement instruments in particular. For example, in addition to the waveforms representing the signals currently received at the channel inputs, waveforms referred to as function waveforms may also be displayed. Function waveforms are waveforms created by processing the signal waveforms. Such processing may include, for example, performing arithmetic manipulations on a signal waveform or combining multiple input signal waveforms in some predetermined manner. The resulting waveforms are placed in a display memory for subsequent retrieval and display. In addition, memory waveforms may also be displayed. Memory waveforms are waveforms which have been stored in memory. In addition to the above waveforms, other display elements such as marker indicators, trigger indicators, etc. are typically displayed.

A primary function provided by signal measurement systems in the analysis of signals is to perform automated measurement of desired signal parameters. Automated measurements allow a user to quickly and accurately determine key parameters of acquired signals without the use of manual calculations. Furthermore, automated measurements are a useful and productive technique for characterizing electrical signals using common, well-understood quantities such as peak-to-peak voltage, rise time and frequency. In addition, automated measurements are often used to verify that a given circuit or hardware component satisfies established performance specifications.

To perform an automated measurement in conventional signal measurement systems, a number of actions are typically required to be performed by the user. The desired measurement must be selected and the waveform source for the measurement must be identified. In addition to associating the selected measurement with a source waveform, additional information may need to be specified including, for example, the portion or extent of the selected waveform over which the measurement is to be applied.

Conventional techniques for invoking oscilloscope measurements often involve the use of push-button keys on the instrument's front panel. A measurement is selected by depressing a dedicated key with the associated measurement's name printed on or above it. A source waveform is subsequently identified either by pressing a key associated with a particular channel or other signal or by turning a knob that scrolls through a list of possible sources.

In another conventional approach, the desired measurement is selected by pressing a multifunction 'softkey' whose current function is to invoke a given measurement. Typically, the softkey is located near a textual or graphical display of the key's current function. With this approach, the current function of the softkey must first be assigned through the activation of a 'menu' or 'setup' key. The menu/setup key may be a fixed function key located on the front panel, or may itself be a softkey whose current function is to assign functions to one or more softkeys. In these conventional systems source waveform selection is typically accomplished with still additional softkey operations. In other conventional instruments a hybrid solution is sometimes employed. For example, measurement selection is accomplished with fixed functions keys, while source waveform selection is performed using softkeys.

As noted, in addition to selecting the measurement and source waveform oftentimes a specific region of the selected waveform on which the measurement is to be applied must be selected by the user. For such measurements, the desired horizontal extent of the selected waveform should be selected for measurement. For example, an individual pulse among a series of pulses may need to be selected to measure the period of the signal. Conventional signal measurement systems employ several different methods to select specific waveform regions. In one conventional approach, such measurements are applied to the first cycle of the waveform on the displayed waveform beginning with the left-most pulse. In these systems, the horizontal position controls must be adjusted by the user so that the pulse of interest appears at the left-most position on the waveform display.

In other conventional approaches a set of marker indicators (visual lines with adjustable vertical and horizontal positions) must be activated and positioned such that the markers bound the region of the signal to be measured. Yet another approach requires the user to enter a numeric value to specify the number of the pulse of interest relative to the total number of pulses displayed. Another approach is to eliminate the need for region selection by adjusting both horizontal scale and position and perhaps the trigger specification such that only the single pulse of interest appears on the waveform display.

There are a number of drawbacks to these conventional approaches. First, these conventional techniques require multiple key presses and/or knob turns to be carried out in a specified sequence in order to properly invoke a measurement. Not only is such an arrangement difficult to understand and operate, considerable time is consumed performing the requisite steps to obtain a desired measurement. This is particularly the case when a number of measurements are to be performed on different regions of one or more waveforms. To perform such a series of measurements in conventional systems, very complex procedures must be performed to successively select particular regions of the waveform, resulting in a system which is difficult for the novice or infrequent user to operate and understand.

Moreover, the requirement to select a region or horizontal extent often places additional sequencing constraints on the overall invocation process. Common to many implementations of conventional systems is the requirement that the region identification must be performed prior to selection of the measurement. Thus, these conventional approaches require both the waveform and waveform region to be selected prior to the selection of the waveform. This is often counterintuitive to the typical user who most often wants to choose the measurement first, then apply the measurement to a certain part of a certain signal.

A further drawback to these conventional approaches is the limited indications provided to the user with instructions and feedback. For example, certain measurements are only applicable to certain types of waveforms. No indication is provided to notify a user that an attempt to apply a measurement to a waveform is incorrect. As a result, the user may navigate through a significant series of softkey layers to select the source waveform, manipulate various knobs to identify the region to measure, and then again navigate among a series of softkeys to select the measurement. It is not until after these operations are performed that a determination is made and the user is informed of the incorrect assignment, causing the user to repeat a significant number of procedural steps to invoke a proper measurement.

What is needed, therefore, is a simple, intuitive means for performing measurements on waveforms which does not erect a productivity barrier that hinders more widespread use of automated measurement functions.

SUMMARY OF THE INVENTION

The present invention is a system and methodology for use in a signal measurement system having a graphical user interface. In one aspect of the invention a waveform measurement invocation system is disclosed. The measurement invocation system is configured to provide graphical control elements on the graphical user interface such that the selection of a control element invokes a measurement operation on a selected displayed waveform.

In another aspect of the invention a graphical system for signal measurement invocation is disclosed. In the system a descriptive icon representing a measurement function is displayed on a graphical user interface of a signal measurement system proximate to a displayed waveform. The measurement function is invoked by a user selecting and dragging the icon across the graphical user interface and releasing the icon at a position proximate to the displayed waveform.

In another aspect of the invention, a measurement invocation system for automatically performing a waveform measurement function when graphically associated by a user with a waveform displayed in a waveform display region of a graphical user interface is disclosed. The measurement invocation system includes a measurement toolbar manager configured to display on the graphical user interface one or more measurement icons. Each of the icons corresponds to a waveform measurement function. The toolbar manager identifies which of the one or more measurement icons has been selected by the user. A waveform identifier enables the user to graphically associate the selected measurement icon with a source waveform and determines a point of measurement invocation on the source waveform. The invocation system also includes a measurement controller that invokes the selected measurement function on a measurement extent of the source waveform when the association of the selected measurement and the source waveform is a valid association. Preferably, the measurement icons are arranged within a measurement toolbar region proximate to the waveform display region of the graphical user interface.

In one embodiment, the measurement toolbar manager includes means for determining which of one or more measurement functions corresponds to each of the one or more measurement icons. In this embodiment, the toolbar manager also includes means for determining which of the one or more measurement icons the cursor is dwelling over on the graphical user interface. In another embodiment, the measurement toolbar manager also includes means for displaying a textual message on the graphical user interface identifying the corresponding measurement function associated with the measurement icon over which the cursor dwells.

In another embodiment, the measurement toolbar manager also includes means for enabling the selected measurement icon to be performed on the selected waveform, in which the selected waveform is identified through a well-known graphical means. Typically, each of the measurement icons is a bitmap that provides a pictorial description of the corresponding waveform measurement function.

In one embodiment of this aspect, the waveform identifier includes means for enabling the user to drag the selected measurement across the waveform display region to a position proximate to the source waveform. The waveform identifier also includes means for determining a nearest display element to the selected measurement icon while the selected measurement icon is dragged across the waveform display region. In another embodiment, the waveform identifier also includes means for displaying graphical indications of whether the nearest display element is a waveform on which a measurement can be performed. Preferably, the graphical indications include altering the selected measurement icon in some manner. In addition, the graphical indications may include displaying textual information on the graphical user interface.

In one embodiment of this aspect of the invention, the measurement controller includes means for determining whether the association of the selected measurement function and the source waveform is a valid association. Preferably, the measurement controller includes means for determining waveform characteristics defining the measurement extent relative to the point of measurement invocation on the selected waveform. The measurement extent may include an entire displayed source waveform as well as a period of said displayed waveform.

In another embodiment, the measurement controller also includes means for determining whether additional information is required to perform the selected measurement, and for graphically requesting such information. The measurement results are displayed in a predetermined region of the graphical user interface. Preferably, the predetermined region is a transparent region of the waveform display region.

Preferably, the point of measurement invocation and the measurement results are symbolically annotated to graphically associate the selected measurement, the point of measurement invocation and the measurement results.

In one aspect of the present invention a method for invoking waveform measurements in a signal measurement system having a graphical user interface is disclosed. The method for invoking waveform measurements includes the of: (a) determining when a cursor dwells at a pixel location in a measurement toolbar region of the graphical user interface; (b) determining which of one or more measurements is selected by the user, said measurement being associated with a measurement icon in said measurement toolbar region; (c) determining a validity of an association of said selected measurement and a selected source waveform displayed on a waveform display region of the graphical user interface; (d) obtaining additional information for said selected measurement; (e) performing said selected measurement on a measurement extent of said selected source waveform; and (f) displaying results of said measurement on said graphical user interface.

In another aspect of the present invention a method for invoking waveform measurements in a signal measurement system having a graphical user interface is disclosed. The method for invoking waveform measurements includes the steps of: (a) displaying a measurement toolbar consisting of a series of graphical buttons on the graphical user interface, each said graphical button including a bitmap pictorially representing a corresponding measurement; (b) positioning the cursor over an appropriate graphical button; (c) depressing said mouse button; (d) dragging the measurement icon proximate to a specific region of a source waveform; (e) releasing said mouse button to drop said measurement on said selected source waveform; (f) performing said measurement on said selected source waveform; and (g) displaying results of said measurement on the graphical user interface.

In another aspect of the present invention a system for annotation measurement results in a signal measurement system presented on a graphical user interface is disclosed. The system includes a measurement means for performing a measurement function on a measurement extent of a selected source waveform displayed in a waveform display region of the graphical user interface, said measurement means presenting measurement results in a results display region of said graphical user interface; and an annotation means for annotating with a common symbol said measurement extent of the selected source waveform and the measurement results is the results display region.

In one embodiment, the annotations are geometric symbols. In an alternative embodiment the annotations are of a color other than a color of said source waveform.

Advantageously, the present invention provides an intuitive, expedient and graphically-integrated process that enables the user to invoke a measurement of a desired waveform and region in a sequence which is analogous to the manner in which an engineer or technician thinks about performing such measurements. Graphically placing a graphical depiction for a measurement on a displayed waveform is a very natural procedure that captures the essence of invoking a measurement as compared with conventional approaches of multiple knob adjustments and softkey selections.

Another advantage of the present invention is that it provides the user with continual feedback as the cursor is placed over the measurement icon and dragged across the waveform display. This feedback includes identification of the selected measurement, whether the measurement icon is sufficiently close to a source waveform to be applied to that waveform, whether the user has selected a correct association of measurement and source waveform, etc. This continual feedback enables the user to evaluate the accuracy of the actions prior to the invocation of the measurement.

A still further advantage of the present invention is that it provides the user with ability to graphically associated selected measurement functions with a desired waveform in a simple and intuitive manner. The common annotation of the displayed waveforms and resulting measurements clearly identifies to the user the measurement being performed, the portion of the waveform to which the measurement is applied, and a correlation between the displayed results and the measured waveform.

Furthermore, the present invention enables the user to achieve greater productivity due to the minimal number of actions that have to be performed to invoke a measurement. Productivity is also increased due to the speed due to the minimal amount of time required to learn and understand how to operate the measurement functions. Users interact with measurements and waveforms in a very direct way, one that builds on familiarity with the graphical user interfaces on computers and other products.

Further features and advantages of the present invention as well as the structure and operation of various embodiments of the present invention are described in detail below with reference to the accompanying drawings. In the drawings, like reference numbers indicate identical or functionally similar elements. Additionally, the left-most one or two digits of a reference number identifies the drawing in which the reference number first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION

Figure 1:
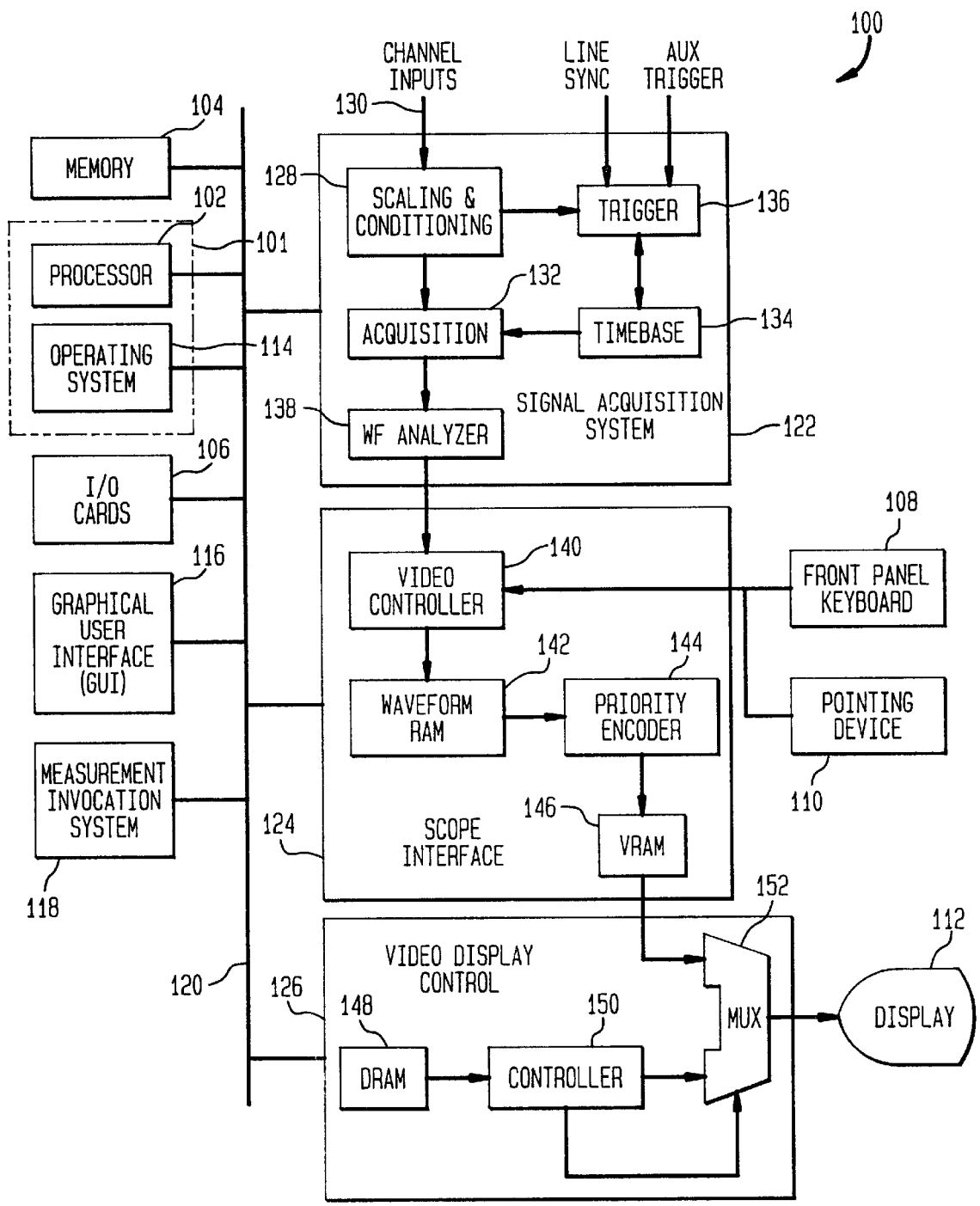
FIG. 1 is a functional block diagram of a digital oscilloscope suitable for implementing the measurement invocation system and method of the present invention.

The present invention is a measurement invocation system and method that may be implemented in any signal measurement system having a graphical user interface wherein the user has the capability of controlling a cursor on a waveform display. In one preferred embodiment of the present invention, the measurement invocation system is implemented in a test and measurement instrument, such as a digital or analog oscilloscope, logic analyzer, network analyzer, spectrum analyzer or waveform generator. FIG. 1 is a functional block diagram of an exemplary digital oscilloscope suitable for implementing the signal scaling system and method of the present invention.

The digital oscilloscope 100 is a commonly-available digital oscilloscope designed to acquire, analyze and display a wide variety of signals generally in terms of the voltage of the signals versus time. The digital oscilloscope 100 preferably includes a general purpose computer system, which is programmable using a high level computer programming language, and specially programmed, special purpose hardware for performing signal acquisition, analyze and display functions.

The digital oscilloscope 100 includes a processor 102, a memory unit 104, input/output (I/O) interface cards 106, storage units (not shown) such as a hard disk drive and a floppy disk drive, one or more input devices such as front keyboard panel 108 and pointing devices 110 and display 112. The memory 104 is used for storage of program instructions and for storage of results of calculations performed by the processor 102. In a preferred embodiment, the memory 104 includes random access memory (RAM). The display is preferably a liquid crystal display and is logically or physically divided into an array of picture elements (pixels). The input/output (I/O) interface cards 106 may be modem cards, network interface cards, sound cards, etc.

The processor 102 is typically a commercially available processor, such as the Pentium microprocessor from Intel Corporation, PowerPC microprocessor, SPARC processor, PA-RISC processor or 68000 series microprocessor. Many other processors are also available. Such a processor usually executes a program referred to as an operating system 114, such as the various versions of the Windows operating systems from Microsoft Corporation, the NetWare operating system available from Novell, Inc., or the Unix operating system available from many vendors such as Sun Microsystems, Inc., Hewlett-Packard and AT&T. The operating system 114 controls the execution of other computer programs such as a graphical user interface (GUI) 116 and the measurement invocation system 118, and provides scheduling, input-output control, file and data management, memory management, and communication control and related services. The processor 102 and operating system 114 define a computer platform shown by dashes block 101, for which application programs in high level programming languages are written. The functional elements of the digital oscilloscope 100 communicate with each other via bus 120.

The digital oscilloscope 100 includes a signal acquisition system 122, a scope interface card 124 and video control 126. The signal acquisition system 122 includes scaling and conditioning 128 that receives input signals through channel inputs 130. The scaling and conditioning unit 128 and acquisition unit 132 include well-known high frequency electronics for signal acquisition, signal conditioning, and analog-to-digital conversion, all of which are controlled by the computer system 101 and are considered to be well-known in the art. The timebase 134 drives the analog-to-digital conversion process performed in acquisition 132, specifying when to sample the input signals and how many samples are to be taken. The trigger 136 synchronizes the acquisition process through the timebase 134, enabling the user to arrange a trigger event to obtain a stable waveform display of the desired features of one or more of the input signals. Trigger 136 may be based upon a line sync or auxiliary trigger input, as is well known in the art.

The waveform analyzer 138 performs measurement processes for developing the waveform for display. It contains hardware and software to perform well-known operations such as setting the analog-to-digital codes for the acquisition unit 132 and mapping the resulting digital information to the physical pixel locations which are ultimately presented on display 112 under the control of GUI 116. The pointing device 110 and/or the keyboard 108 are used to move a cursor on the GUI-controlled display 112 to select display elements under the cursor. The pointing devices 110 may include any number of pointing devices such as a mouse, trackball or joy stick. Of course, the cursor may be controlled with one or more keyboards 108 located externally or integrated into a front panel of the digital oscilloscope 100.

The scope interface card 124 includes a video controller 140 that controls the rendering of pixels into the waveform random access memory (RAM) 142. It also receives display element control commands and cursor input information from the front panel keyboard 108 and the pointing device(s) 110. The waveform RAM 142 includes a data structure for each pixel location on the display 112. The data structures contain information regarding every display element that is to be drawn at each pixel location. Although there may be multiple display elements which are to be drawn at a given pixel location, only one color may be rendered at that location. The waveform RAM 142 supplies the priority encoder 144 with this information. The priority encoder 144 prioritizes the competing display elements. For example, if the user arranged a marker and a waveform such that they are located in the same pixel location, then the priority encoder 144 selects that display element with a highest predetermined priority. In such an example, the color of the marker is rendered at the pixel location providing a display that appears to show the marker over the waveform. The priority encoder then sends the selected color to the VRAM 146 which then causes the pixel to be rendered in the indicated color.

The video display controller 126 includes a dynamic random access memory (DRAM) 148 which contains data specifying a color for each pixel in the display 112. Likewise, the video random access memory (VRAM) 146 also contains data specifying a color for each pixel in the display 112. The computer system 101 controls the information in DRAM 148 while the signal acquisition system 122 controls information in the VRAM 146. For each pixel in the display 112, the video controller 126 selects whether the pixel in the display 112 is specified from VRAM 146 or DRAM 148. In general, information in VRAM 146 includes digitized waveforms being generated by the system 122 with high rates of change that are much too fast for software processing by the computer system 101 for real-time display of the waveforms on display 112.

Video controller 126 includes a controller 150 and a multiplexer 152. Controller 150 controls which of the two inputs to the multiplexer 152 are processed into display signals for transmission to the display 112 under the control of the graphical user interface 116. The controller 150 typically monitors color data sent from the DRAM 148 and may be programmed to switch the multiplexer 152 to a different input when a particular programmed color is received from the DRAM 148. a rectangular pixel area is typically defined within DRAM 148 with the programmed color, typically dark gray. The programmed color is not displayed, but instead serves as a data path switch control for the multiplexer 152. Therefore, within the programmed color rectangle, display data comes from VRAM 146. When various control functions are needed, an interactive dialog box is drawn within the programmed color rectangle.

The measurement invocation system 118 implements a simple and intuitive method for performing automatic measurements of a desired waveform presented on the graphical user interface 116. The measurement invocation system is a direct, graphical system for measurement invocation wherein descriptive icons representing various measurements are displayed on the graphical user interface proximate to a waveform display region. When the user moves the cursor over a measurement icon, a textual description of the measurement appears. By depressing the mouse button, the user can move ("drag") the cursor along with the measurement icon across the waveform display region of the graphical user interface 116. When the icon is over a desired region of a desired waveform, the user simply releases the mouse button ("drop") and the measurement is activated. Throughout the process, helpful instructions appear on the graphical user interface and communicate the current status of the measurement. The software routines for performing the measurement invocation methodology in accordance with the invention typically reside in memory 104 and/or disk storage devices, and may be stored on a computer-readable medium such as, for example, magnetic disk, compact disc or magnetic tape and may be loaded into the digital oscilloscope 100 using an appropriate peripheral device as known in the art.

Preferably, the measurement invocation system 118 is implemented in any well-known programming language such as C or C++. Those skilled in the art will appreciate that different implementations, including different function names, programming languages, data structures, and/or algorithms may also be used in embodiments of the present invention other than those described below. It should be further understood that the invention is not limited to a particular computer platform, particular operating system, particular processor, or particular high level programming language, and that the hardware components identified above are given by way of example only. The measurement invocation system may be implemented, for example, in dedicated hardware, firmware, or any combination thereof.

Figure 2:
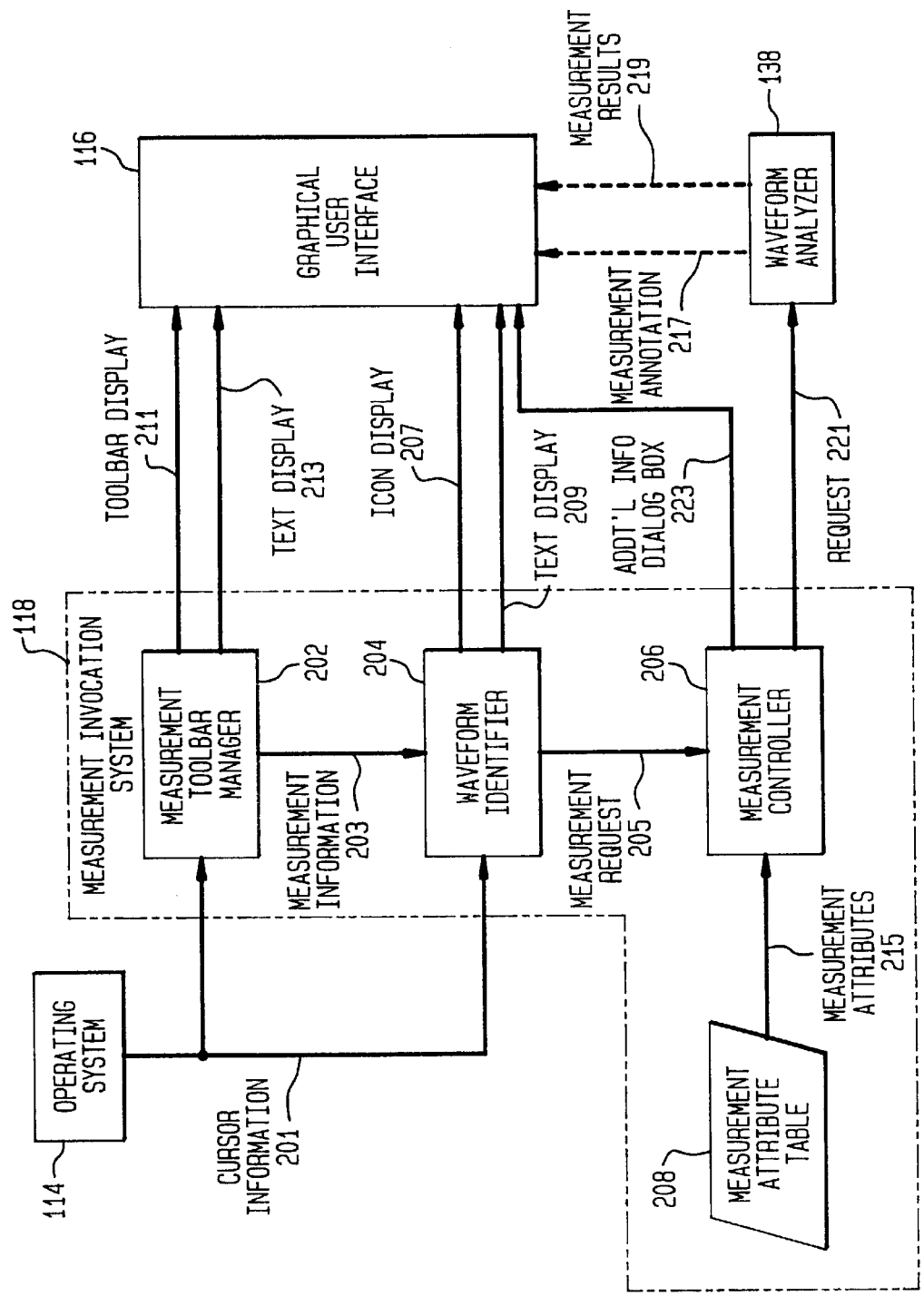
FIG. 2 is a functional block diagram of one embodiment of the measurement invocation system implemented in the digital oscilloscope illustrated in FIG. 1.

A preferred implementation of the present invention is in test and measurement equipment having a graphical user interface 120, such as the digital oscilloscope 100. A functional block diagram of one preferred embodiment of the measurement invocation system 118 of the present invention implemented in the digital oscilloscope 100 is shown in FIG. 2. The function and operation of the measurement invocation system 118 will be described with reference to an exemplary graphical user interface 300 illustrated in FIGS. 3A through 3E.

The graphical user interface 300 includes a waveform display region 302 surrounded by a number of information and control menus around its periphery. One such menu bar is a measurement toolbar region 304 of the present invention. The measurement toolbar region 304 is preferably proximate to the waveform display region 302; in the illustrative embodiment, it is shown to be adjacent to the left hand side of the waveform display region 302. In the illustrative example shown in FIGS. 3A through 3E, two waveforms are displayed in the waveform display region 302: A channel 1 waveform 306A and a channel 2 waveform 306B.

Referring to FIG. 2, the measurement invocation system 118 includes a measurement toolbar manager 202, a waveform identifier 204 and a measurement controller 206. The measurement toolbar manager 204 displays one or more graphical buttons referred to as measurement icons 308A–308H (referred to generally and collectively as measurement icons 308). Each measurement icon 308 is a bitmap that provides a pictorial description of the measurement function, or measurement, corresponding to that button.

The represented measurements may be any well-known waveform measurement functions now or later developed. According to the present invention, each measurement function is automatically performed when graphically associated by the user with a measurable waveform 306 displayed in the waveform region 302. Such a waveform is referred herein as a source waveform 306. The toolbar manager 204 determines which measurement icon 308 the cursor is over when the cursor is positioned within the measurement toolbar region 304.

The toolbar manager 204 also determines which measurement function is associated with a selected measurement icon 308. The measurement icon 308 is selected by dwelling the cursor over the icon and depressing a predetermined mouse button. The measurement icon 308 is selected to be dragged to a source waveform 306 or to be automatically activated.

The waveform identifier 204 enables the user to graphically associate a selected measurement with a source waveform 306. Specifically, the waveform identifier 204 enables the user to drag the selected measurement icon 308 across the waveform display region 302 and determines the nearest display element to the dragged icon. The identifier 204 provides the user with graphical indications of whether the nearest display element is a waveform on which a measurement can be performed. If the display element is a measurable waveform, the waveform identifier 204 preferably provides graphical indications of such. When the user selects a source waveform 306 through the positioning and release of the mouse button, the waveform identifier 204 determines the point of measurement invocation on the selected waveform 306, referred to herein as the drop point.

The measurement controller 206 determines the validity of the association of the selected measurement function and the source waveform 306. If the waveform is of a type to which the selected measurement may be applied, then the measurement controller 206 determines the measurement extent. That is, the controller 206 determines whether this is a measurement that is subject to operating on the entire displayed source waveform or only on an extent of the source waveform. If the measurement is to be performed on a particular extent of the source waveform 306, then the waveform characteristics defining the extent are determined relative to the drop point. The controller 206 also determines whether additional information is required to perform the selected measurement. If so, the controller 206 graphically requests such information. The controller 206 requests the waveform analyzer 138 to perform the desired measurement on the specified extent of the selected source waveform 306, providing the waveform analyzer 138 with all necessary information to perform the requested measurement. The measurement results are displayed in a predetermined region 310 of the graphical user interface 116, preferably in a transparent region of the waveform display region 302. Preferably, the drop point and displayed measurement results are symbolically annotated to enable the user to easily associate the selected measurement, the results of that measurement and the location on the source waveform 306 where the measurement is being applied.

Specifically, the measurement toolbar manager 202 maintains the rendering of measurement toolbar region 304. This includes providing the operating system 114 with the icon bit maps forming the measurement icons 308 which are to be displayed at predetermined positions on the graphical user interface. Such rendering of icons on a graphical user interface is considered to be well known in the art, and is represented herein as a toolbar display request 211 to the graphical user interface 116.

The measurement toolbar manager 202 receives an indication 201 from the operating system 114 of the position of the cursor and a selection indication identifying when the user has depressed the implementing pointing device switch, which is preferably a mouse button. The measurement toolbar manager 202 generates measurement information 203 which is utilized by the waveform identifier 204. The measurement information 203 includes a measurement function identification (ID) and a measurement icon ID.

The measurement toolbar manager 202 maintains the pixel geometry of each measurement icon 308 in the measurement toolbar 304 in an internal data structure. Associated with each measurement icon is the icon ID and the measurement ID corresponding to the measurement icon 308. It is noted that the internal data structure may take on any well-known configuration appropriate for the particular application of the present invention.

Figure 3A:
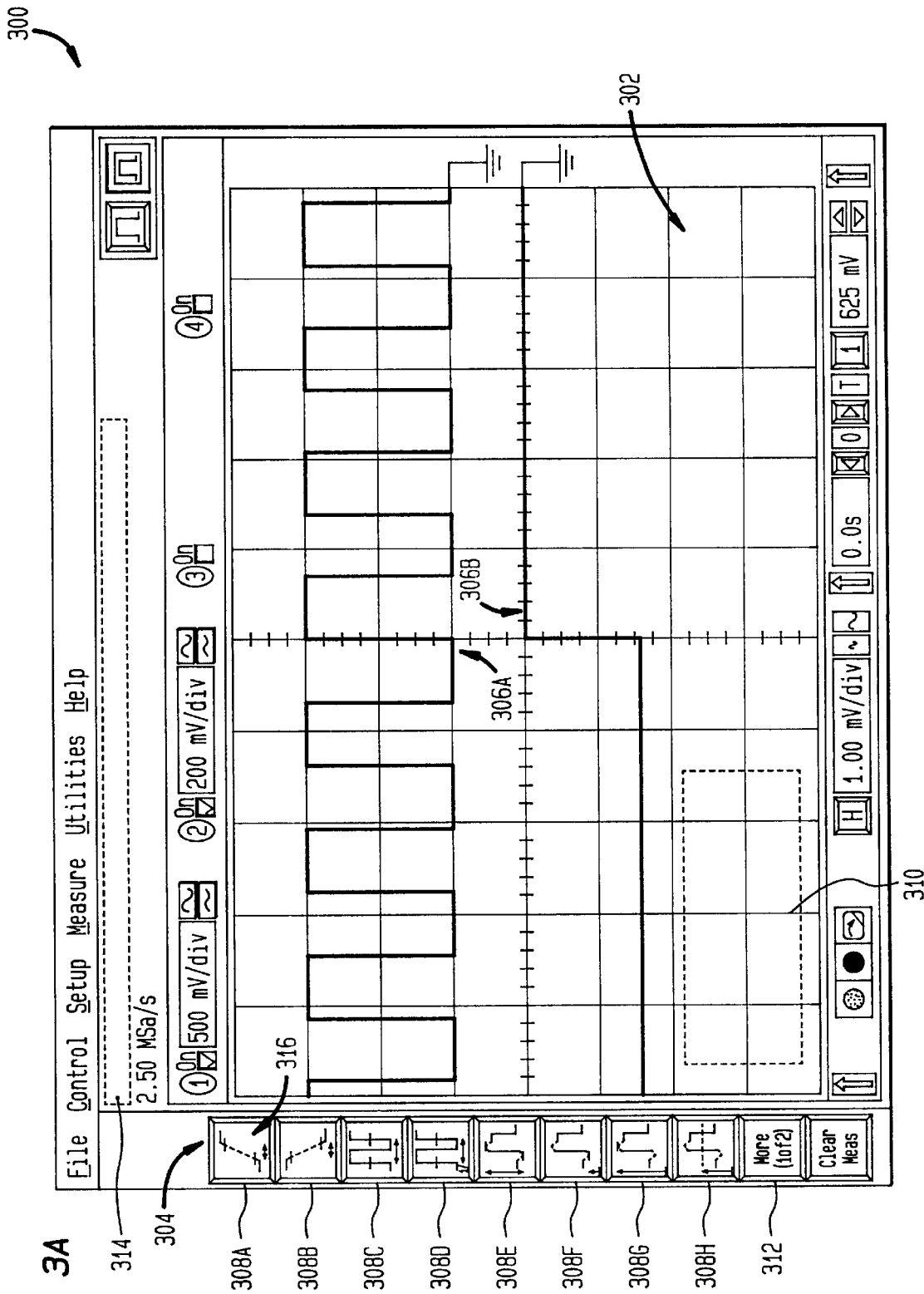
FIG. 3A is an illustration of a graphical user interface having a waveform display region and a measurement toolbar region in accordance with the present invention.

In a preferred embodiment, the measurement toolbar 304 displays one of a possible many panes of measurement icons 308, proving a button 312 to step through each pane until a desired series of measurement icons is displayed. In such an embodiment, the data structure also includes information identifying which pane of measurement icons 308 is currently visible on the graphical user interface 116. In the illustrative embodiment, there are two panes of measurement icons. Accordingly, as shown in FIG. 3A, there is a "More (1 of 2)" button 312 below the measurement icons 308 in the toolbar region 304 to enable the user to display the other pane measurement icons. In an alternative embodiment, the display measurement icons 308 is managed with a scrollbar mechanism rather than panes, as is well known in the art.

The measurement toolbar manager 202 determines when the cursor is located over the toolbar region 304 and, if so, which measurement icon 308 the cursor is currently dwelling over. A cursor is considered to be dwelling over a pixel location when it remains stationary over that pixel location for a predetermined period of time. As the user dwells the cursor over a measurement toolbar icon 308, the measurement toolbar manager 202 generates a message in an information bar 314 identifying the type of measurement function that is associated with the measurement icon 308. In a preferred embodiment, this is achieved utilizing well-known and currently available function calls to the operating system 114, such as the various "ToolTips" function calls provided by the Windows 95 operating system. The display of the text message is represented by a text display command 213.

The measurement toolbar manager determines whether the user has selected a particular measurement icon 308. Such a selection may be due to the depression of the assigned mouse button when the user is to drag the icon over a source waveform. Alternatively, such a selection indication may occur when the user has depressed and released the mouse button to activate the represented measurement function for a displayed source waveform 306. In such an embodiment, the identification of the source waveform may be required, preferably through a dialog box, when more than one potential source waveform is currently displayed in the waveform display region 302.

When the measurement toolbar manager 202 receives the selection indication from the operating system 114, it determines which graphical icon button the cursor is currently positioned over based upon the cursor position information also provided by the operating system 114. The measurement toolbar manager 202 determines which icon 308 is located at that button location given the current set of measurement icons currently displayed in the measurement toolbar measurement toolbar region 304. The toolbar manager 202 retrieves the icon ID and measurement function ID from the data structure and provides this information to the waveform identifier 204.

As noted, the waveform identifier 204 enables the user to graphically associate a selected measurement with a source waveform 306. The waveform identifier 204 receives the measurement information 203 from the toolbar manager 202. The waveform identifier 202 includes an interface with the digital oscilloscope 100 to obtain cursor information 201. As noted, the digital oscilloscope 100 is preferably a computer-based system containing computer system 101. Typically, in such embodiments, cursor information 201 is obtained from the operating system 114 running on the processor 102 through the generation of well-known procedure calls.

The cursor information 201 includes the current position of the cursor on the graphical user interface 116 and an indication of when the user has selected a pixel location on the waveform display region. The selection indication independently identifies whether the user has depressed a an assigned mouse button or released a previously-depressed mouse button.

The waveform identifier 204 determines whether a pixel location has been selected by the user based upon these inputs in a well-known manner. Preferably, the waveform identifier 204 includes a hit-test system as described in commonly owned U.S. patent application Ser. No. 08/863, 461 entitled "System and Method For Efficient Hit-Testing in a Graphical User Interface," naming as an inventor Jay A. Alexander and filed concurrently herewith, the specification of which is hereby incorporated by reference in its entirety. The preferred hit-test system determines whether the user has selected a cursor position that is sufficiently close to a display element to be considered a selection by the user of that display element or a selection of a background region of the waveform display region. It is understood, however, that the waveform identifier 204 may include or interface with other means for determining whether a pixel location has been selected by the user based upon the above and/or other inputs and using other techniques now or later developed.

As noted, the waveform identifier 204 enables the user to drag the selected measurement icon 308 across the waveform display region 302 and determines the nearest display element to the dragged icon. The waveform identifier 204 performs an initial filtering of the display elements that the cursor is near to as it is being dragged across the waveform display region 302. This enables the waveform identifier 204 to determine if the display elements which are adjacent or close to the current cursor position are measurable or source waveforms. In the illustrative embodiment wherein the measurement invocation system 118 is implemented in digital oscilloscope 100, the source waveforms preferably include channel waveforms, formula waveforms and memory waveforms. The preferred hit-tester of the waveform identifier 204 accesses the VRAM 146 and the waveform RAM 142 to make such a determination.

The waveform identifier 202 also provides the user with an indication that this is a display element on which a measurement can be made. In a preferred embodiment, this indication is provided in a number of display commands to the graphical user interface 114. In one embodiment, the waveform rendered within the icon button 308 are changed from a rendering that represents a generic signal color to the color of the nearest waveform. In addition, the selected measurement icon 308 is drawn with a border of that same color. These well-known function calls are represented by icon display request 207.

In a preferred embodiment, a textual indication is also provided, preferably in the information region 314. The textual information provides the user with an indication of when the mouse button may be released to apply the measurement function to the nearest waveform or whether the measurement icon 308 is to be dragged further to be sufficiently close to a source waveform. Such indications may be, for example, "Release mouse here to measure channel 1," or "Drag Measurement Icon to an Active Source," etc. The generation of such commands to the graphical user interface 116, shown as text display request 209 in FIG. 2, are considered to be well-known in the art.

The waveform identifier 204 utilizes the icon ID provided by the measurement toolbar manager 202 to continually render the icon 308 at the location of the cursor as the icon 308 is dragged across the waveform display region 302. The waveform identifier 204 displays the icon 308 through a procedure call to the graphical user interface 114 containing the coordinates offset from the cursor position and the icon ID to identify the bitmap which is to rendered at the indicated coordinates.

The waveform identifier 204 also determines the pixel location on the source waveform 306 at which the measurement invocation will occur. As noted, this is referred to as the drop point. This pixel location is determined through the hit-tester which receives identification of the display elements occupying the neighboring pixel locations from the VRAM 146 and waveform RAM 142. Preferably, the cursor is pointing to an edge of the icon button 308 as it is being dragged across the waveform display region 302. However, in a preferred embodiment, this point is not used to determine the drop point. Instead, the drop point is that point of the source waveform 306 which intersects with a center point of the measurement icon button 308.

When the measurement icon 308 is sufficiently adjacent to a source waveform 306 and the user releases the mouse button, then the waveform identifier 204 generates a request 205 to the measurement controller 206 to perform the selected measurement on the selected source waveform 306. This request includes the measurement ID, the waveform ID and the coordinate location of the drop point.

Upon receipt of the measurement request, the measurement controller 206 performs the requisite functions to perform the selected measurement on a measurement extent of a selected source waveform. The measurement controller 206 validates the association of the selected measurement function and source waveform 306. As noted, certain measurement functions can only be applied to certain types of waveforms. This information is preferably contained in a measurement attribute table 208 accessed by the measurement controller 206, although other data structures may be used.

The measurement controller 206 determines whether additional information is required to perform the selected measurement. For example, if the user selected the Volts-RMS measurement icon 308, then the measurement controller 206 provides an indication to the user requesting the user to specify wither the measurement should measure the AC RMS or DC RMS. Likewise, some measurements may be performed on a portion or the entire waveform. For such measurements, the measurement controller 206 displays a request for which portion of the waveform is to be measured.

As noted, if the waveform is of a type to which the selected measurement may be applied, then the measurement controller 206 determines the measurement extent. That is, the controller 206 determines whether this is a measurement that is subject to operating on the entire displayed source waveform or only on an extent of the source waveform. If the measurement is to be performed on a particular extent of the source waveform 306, then the waveform characteristics defining the extent are determined relative to the drop point.

In a preferred embodiment the measurement functions are to be applied either to the complete display of the source waveform 306 or a single pulse of the source waveform. In this embodiment, when the measurement controller 306 determined through accessing the measurement attribute table 208 that the selected measurement is to be performed on a particular extent of the source waveform 306, then the waveform characteristics defining the extent are determined relative to the drop point. If the measurement is such that it may be applied to either measurement extent, then the user must provide additional information the measurement controller 206 to indicate which measurement extent is preferred.

The measurement attribute table 208 is a data structure containing the measurement ID (index), the measurement name (text), the icon ID, and attributes of the measurement function. These attributes include, for example, whether the measurement is a waveform-specific measurement, and if so, which types of waveforms the measurement to which the measurement may be applied. For example, some measurements only operate on FFT waveforms while others, such as rise time, cannot. The attributes also include the number of required source waveforms and whether the measurement function is edge-sensitive. The measurement attribute table 208 is accessed in any well known manner. In addition, the information contents of the measurement attribute table 208 may be embodied in any appropriate data structure.

In addition to the measurement extent, the measurement controller 206 determines whether other addition information is required to perform the selected measurement. If so, the controller 206 graphically requests such information. Preferably, the measurement controller generates a request 221 to the graphical user interface 116 to generate a dialog box requesting the requisite additional information. Exemplary dialog boxes are illustrated in FIGS. 3F–3G.

Figure 3B:
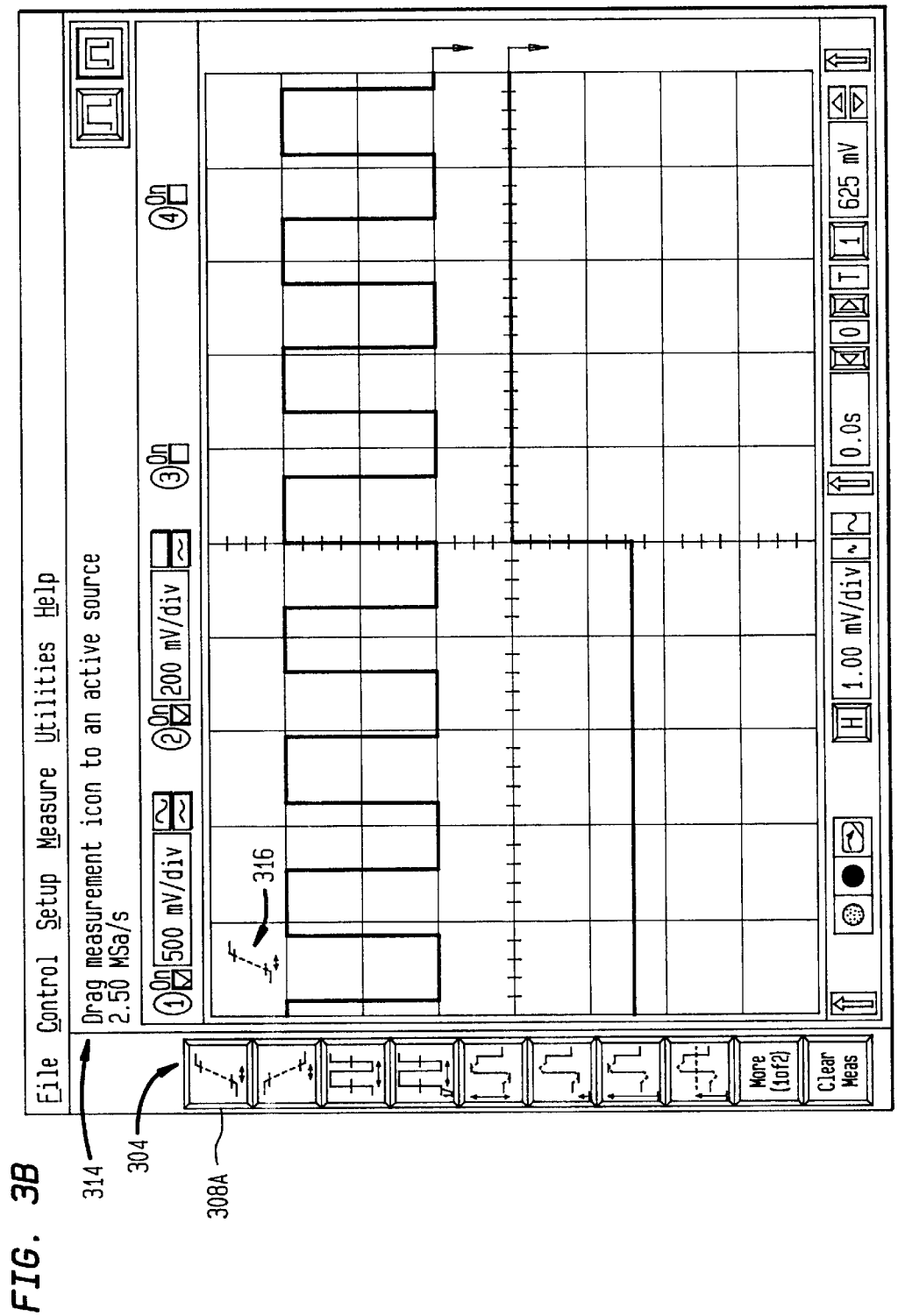
FIG. 3B is the graphical user interface illustrated in FIG. 3A during which the user is dragging a measurement icon across the waveform display region in accordance with the present invention.
Figure 3C:
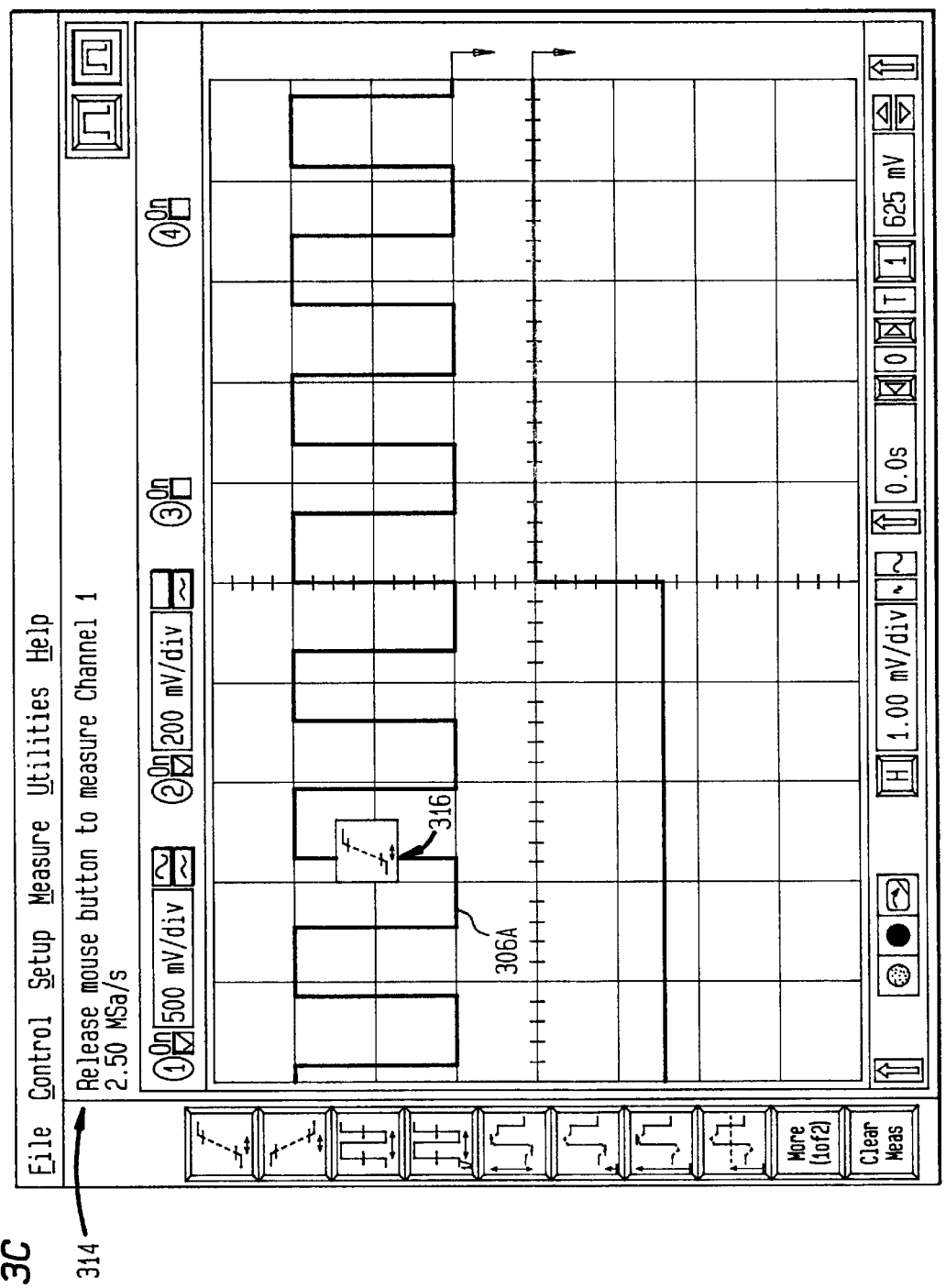
FIG. 3C is the graphical user interface illustrated in FIG. 3A during which the user is placing the measurement icon over a source waveform in the waveform display region in accordance with the present invention.
Figure 3D:
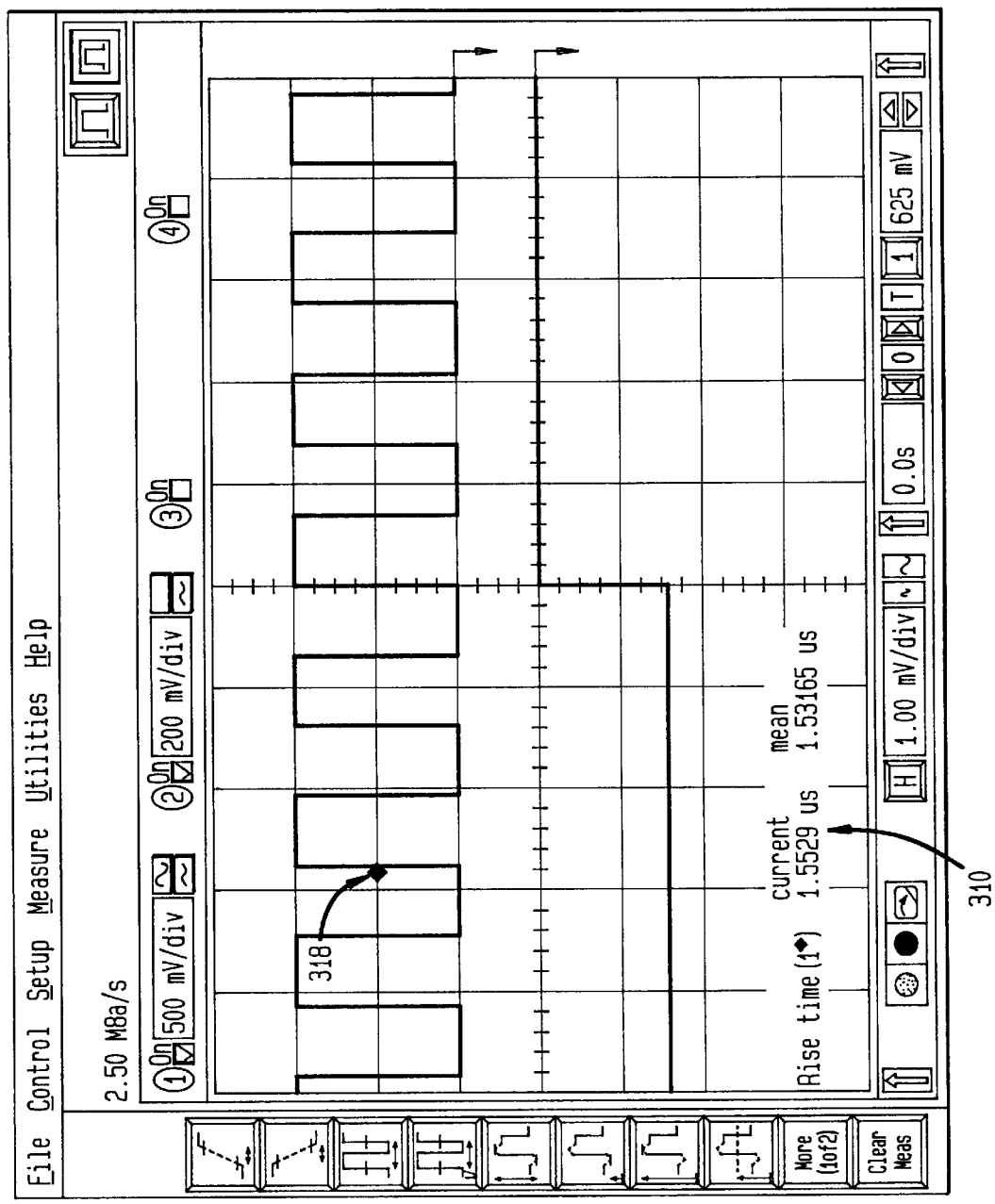
FIG. 3D is the graphical user interface illustrated in FIG. 3A after which the user has dropped the measurement icon on the source waveform and the resulting measurements are displayed in a transparent display region in accordance with the present invention.
Figure 3E:
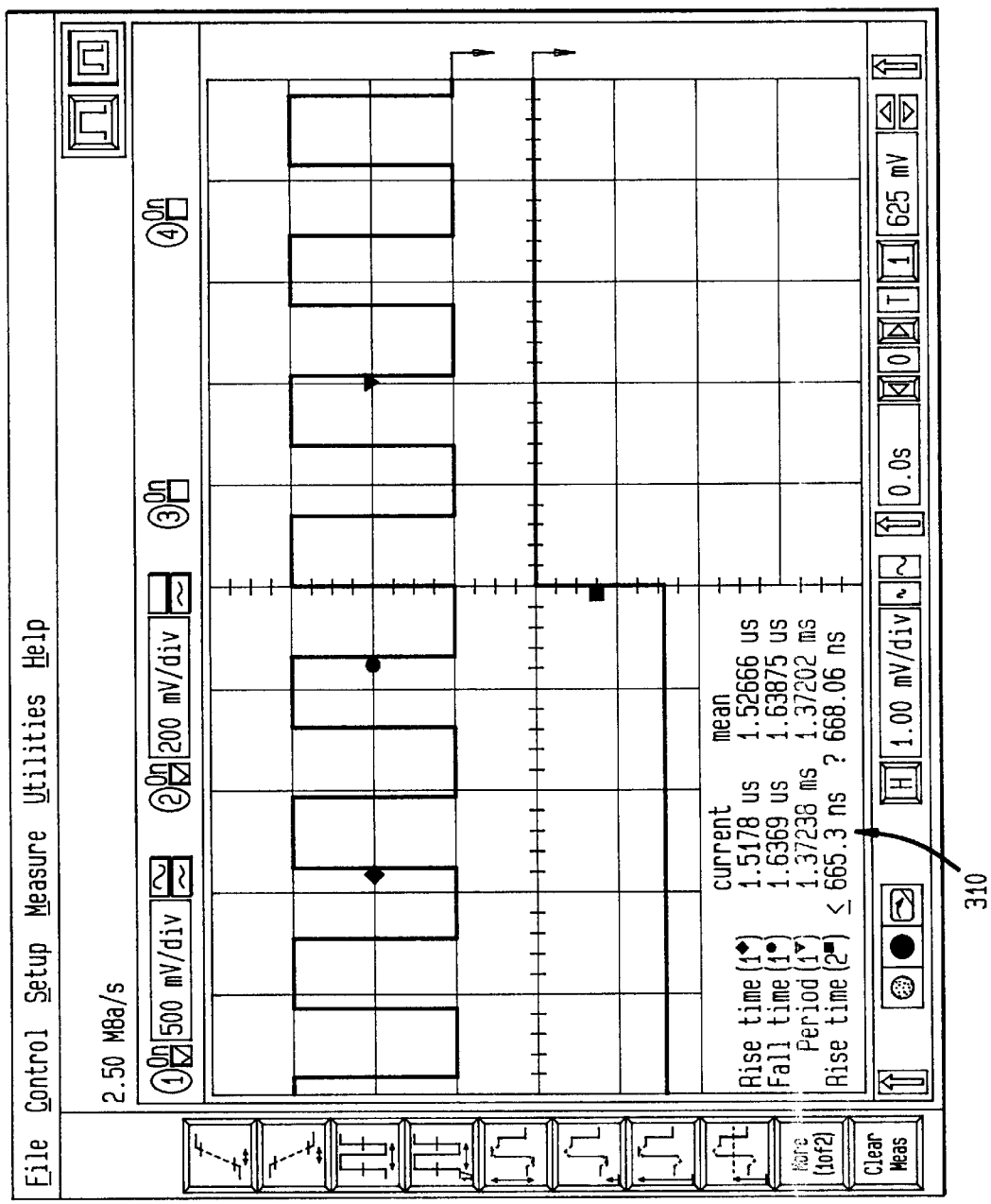
FIG. 3E is the graphical user interface illustrated in FIG. 3A after which the user has invoked four measurements on two source waveforms, wherein each of the measurements are annotated in accordance with the present invention.
Figure 3F:
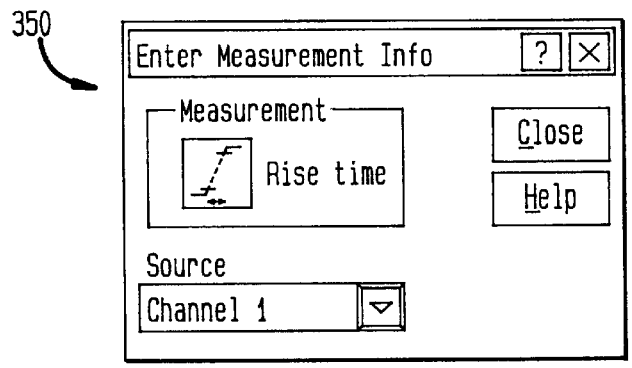
FIGS. 3F–H are example dialog boxes requesting additional information from the user for different types of measurement functions in accordance with the present invention.

In FIG. 3F the selected measurement is rise time and the requested additional information is the source waveform 306. This dialog box is generated in response to the user depressing and releasing the mouse button while the cursor is over the rise-time measurement icon 308A. Such an action causes the rise-time measurement to be automatically invoked at a predetermined default measurement extent of a selected source waveform 306. However, there were at least two such source waveforms currently displayed on the waveform display region 302. As a result, the measurement controller 206 generates a dialog box 350 requesting the user to provide the additional information for which of the currently displayed waveforms is to be the source waveform 306.

Figure 3G:
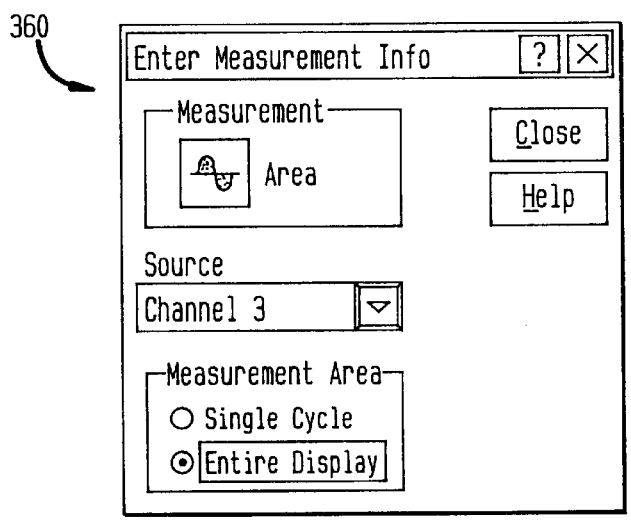

In FIG. 3G the selected measurement is area and the requested additional information is the measurement extent, referred to in FIG. 3G as "measurement area." This dialog box 360 is generated in response to the user dropping the area measurement icon (not shown in FIG. 3A since it is located on the non-displayed pane of icons) over a channel 3 waveform. The waveform source 306 is not required, as shown by the shadow representation of the "source" header. However, this field on the dialog box does indicate that the channel 3 waveform was selected. The area measurement may be performed on either a single cycle of the source waveform or the entire display. The user may select which is desired through the dialog box 360.

Figure 3H:
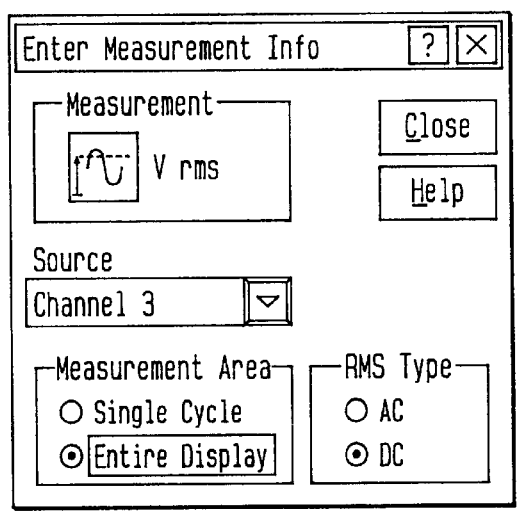

In FIG. 3H the selected measurement is volts-RMS and the requested additional information is the source, measurement extend and RMS type. This dialog box 360 is generated in response to the user dropping the area measurement icon (not shown in FIG. 3A since it is located on the non-displayed pane of icons) over a channel 3 waveform. The first two are described above with reference to FIGS. 3F and 3G. The additional information "RMS type" requests the user to indicate whether AC RMS or DC RMS is desired.

The controller 206 requests the waveform analyzer 138 to perform the desired measurement on the specified extent of the selected source waveform 306, providing the waveform analyzer 138 with all necessary information to perform the requested measurement. The measurement controller 206 provides the drop point coordinate to the waveform analyzer 138, and requests the waveform analyzer 138 to measure the particular waveform characteristic.

If the measurement is to be performed on a pulse, either because the measurement must be performed on the pulse or if the user selected "Single Cycle" on the additional information dialog box, then the measurement is considered to be "edge sensitive." If the measurement is edge sensitive, then the waveform analyzer 138 preferably locates the nearest rising or falling edge of the source waveform 306. In one embodiment, the nearest edge to the drop point may be considered the center edge, with the two neighboring edges defining the pulse of the source waveform to be measured. In an alterative embodiment, the edge closest to the drop point is considered to be the first edge of the pulse to be measured and the waveform analyzer 138 locates the following two edges to define the pulse. As one skilled in the relevant art would find apparent, there are alternative methods to identifying the single cycle or pulse to be measured.

The measurement controller 206 generates a request 217 that requests the waveform analyzer 138 to perform the selected measurement on the selected measurement extent of the source waveform 306. The waveform analyzer 138 returns the measurement results 219 to the graphical user interface through the VRAM 146. This indirect path is illustrated by the dashed lines for the measurement results display request 219 and the measurement annotation display request 217. The waveform analyzer 138 preferably places the measurement results in a transparent region 310 of the waveform display 302. Alternatively, the measurement results may be returned to the measurement controller 206 which will the n present them to the user in a region of the graphical user interface 116.

The measurement results are displayed in a predetermined region 310 of the graphical user interface 116, preferably in a transparent region of the waveform display region 302. Preferably, the drop point and displayed measurement results are symbolically annotated to enable the user to easily associate the selected measurement, the results of that measurement and the location of the source waveform 306 where the measurement is being applied. The resulting measurement display preferably includes a textual description of the measurement function, the numeric results of the measurement and the annotated symbol to cross reference with the source waveform to clearly identify the location at which the measurement function was applied.

Figure 4:
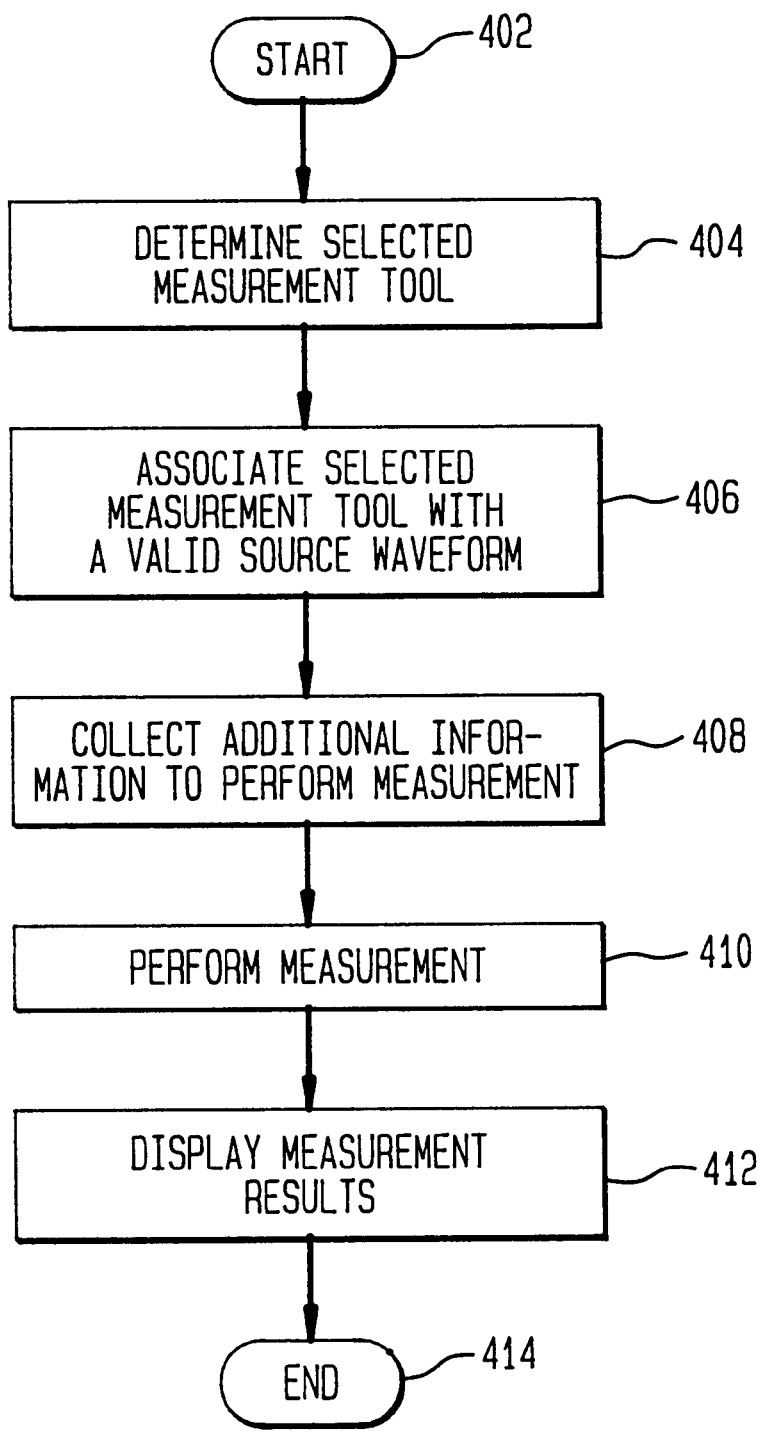
FIG. 4 is a high level flowchart of one embodiment of the measurement invocation method of the present invention.
Figure 5A:
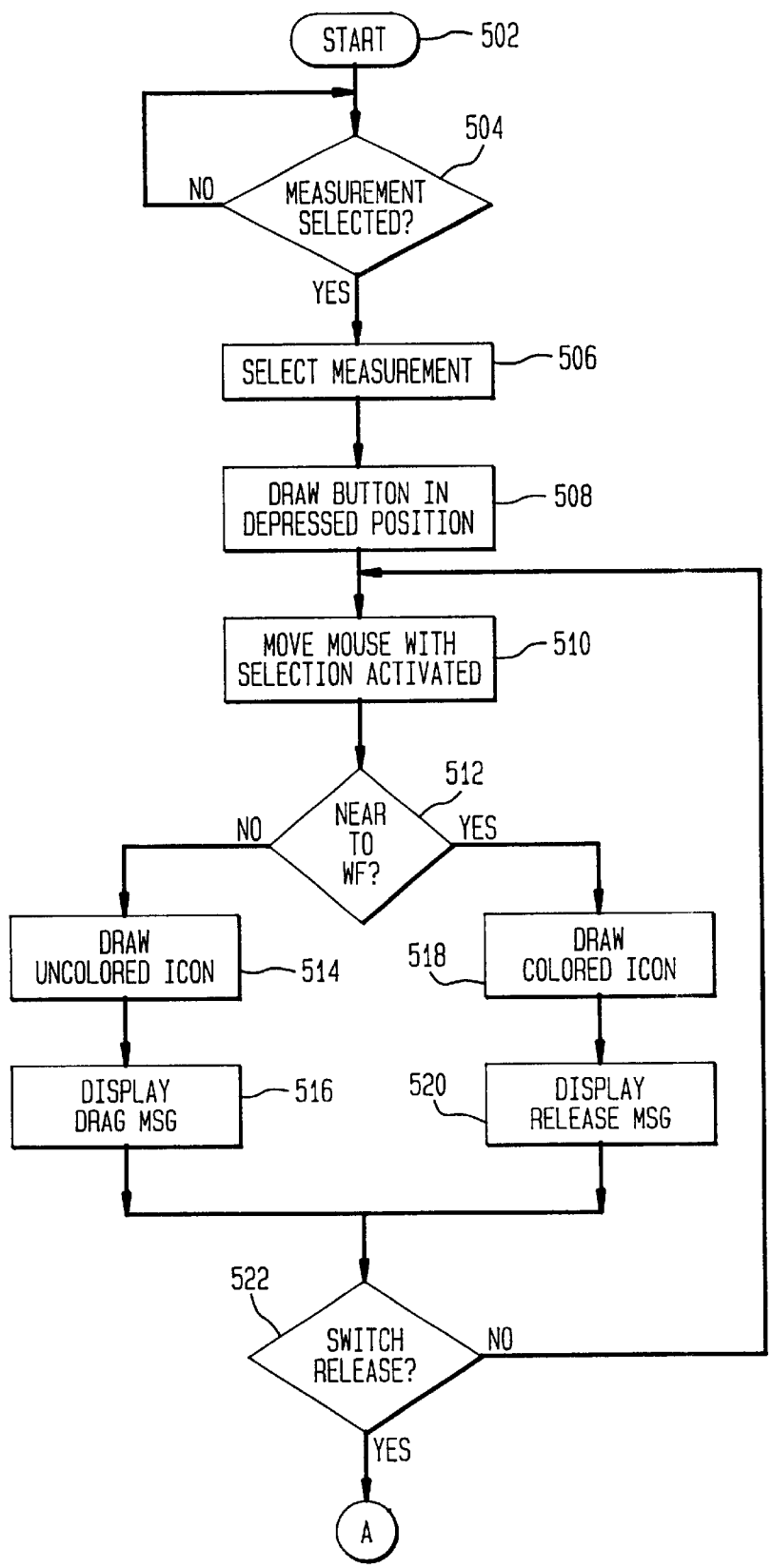
FIGS. 5A–5C are a detailed flowchart of one embodiment of the measurement invocation method of the present invention.
Figure 5B:
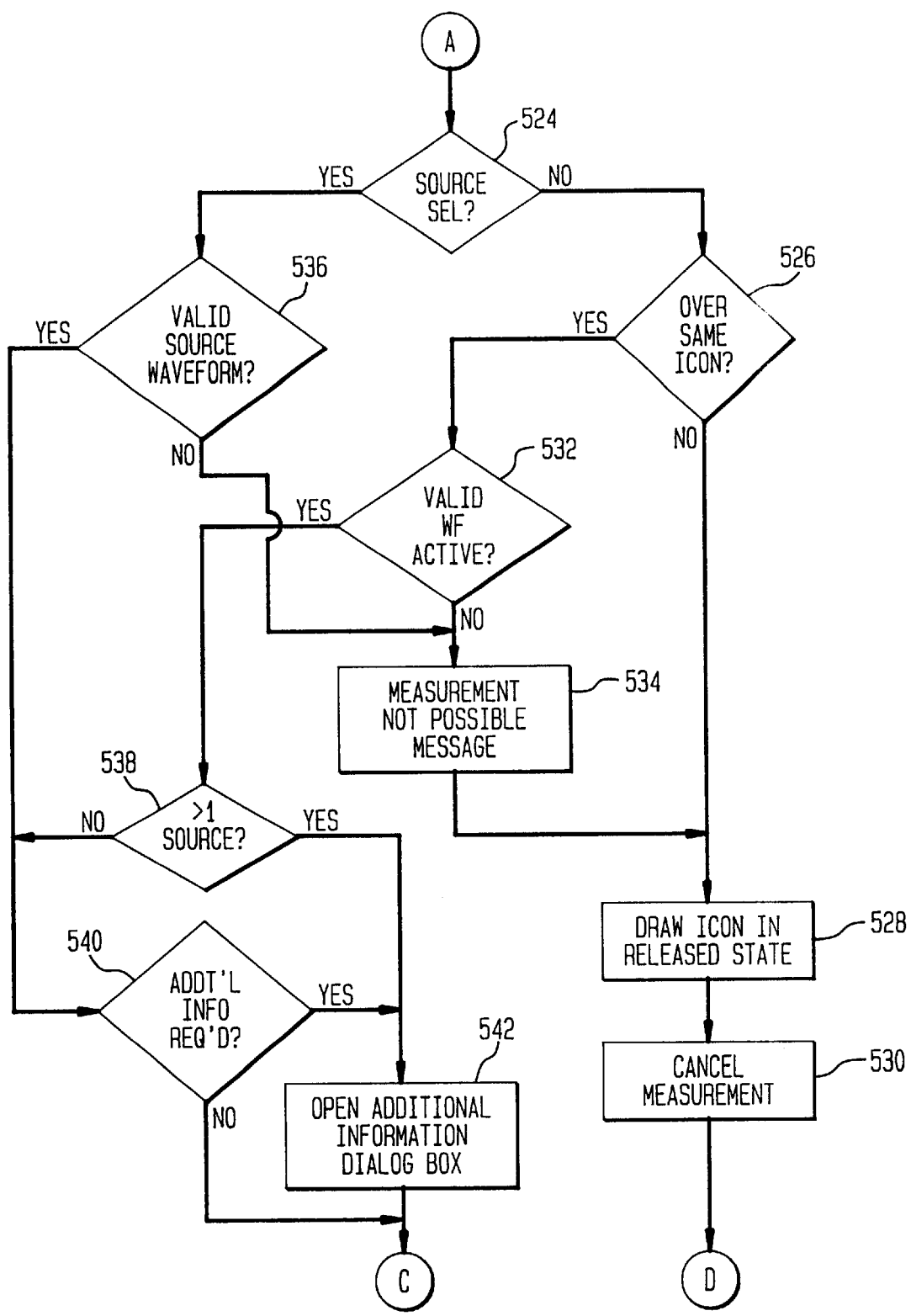
Figure 5C:
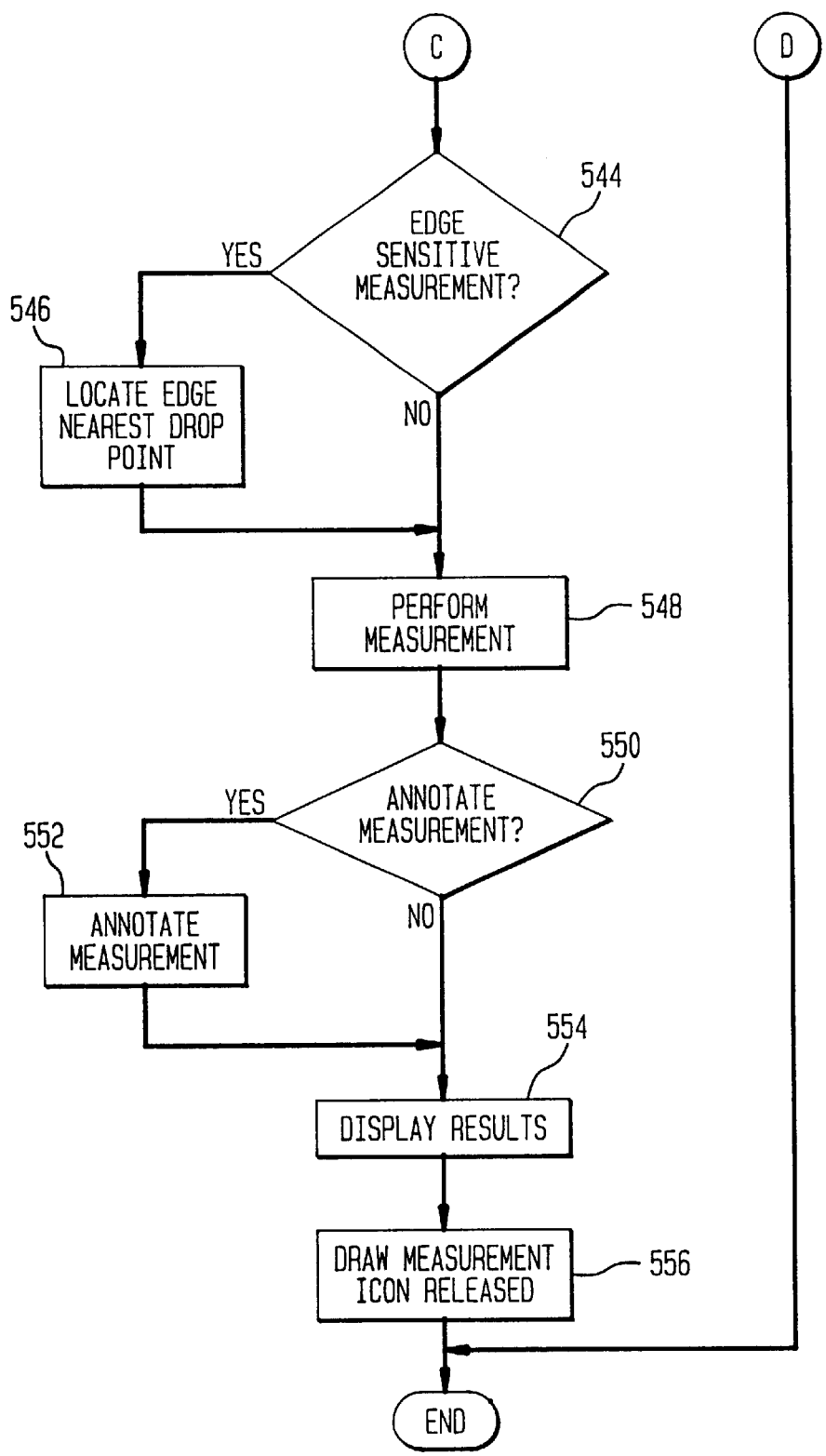

FIG. 4 is a high level flowchart of one embodiment of the measurement invocation method of the present invention. FIGS. 5A–5C are a detailed flowchart of one embodiment of the measurement invocation method of the present invention. The process and operation of the present invention will be described with reference to an exemplary multiple measurement invocation process illustrated in FIGS. 3A through 3E.

Referring to FIGS. 4 and 3A, at start block 402 the measurement invocation process of the present invention begins when the user dwells the cursor 316 at a pixel location in the measurement toolbar region 304. As shown in FIG. 3A, the cursor 316 is positioned over the rise-time measurement icon 308A. At block 404 the selected measurement is determined. This determination is based upon the user's placement of the cursor 316 on the graphical user interface 116 and the activation of the mouse button. The cursor 316 must be located above the measurement icon button 308A when the mouse button is depressed for the user to have been considered to select the particular associated measurement function (rise-time).

At block 406 the selected measurement is associated with a valid source waveform. Here, the user activates an automatic measurement through the depression and release of a measurement icon, or through dragging and dropping the measurement icon 308 over a selected source waveform. Referring to FIG. 3B, the rise-time measurement icon 308A is being dragged across the waveform simply region 302 with cursor 316. In addition, a determination is made as to whether the selected measurement may be performed on the selected source waveform. Referring to FIG. 3C, the rise-time measurement icon 308A is dwelling adjacent to the channel 1 waveform 306A.

If at block 406 it is determined that the associated between the measurement and source waveform is valid, then at block 408 additional information for the selected measurement is obtained. If additional information is required from the user for the selected measurement, a request for such information is provided on the graphical user interface 116. In a preferred embodiment, the additional information dialog boxes illustrated in FIGS. 3F–3H are presented to the user to obtain the additional information. These dialog boxes are described in detail below.

After the requisite information is provided by the user, the measurement is calculated at block 410 and the measurement data is displayed at block 412 for the selected measurement and selected source waveform. Referring to FIG. 3D, the measurement results are displayed in a transparent display region 310. Processing then ceases at block 410.

FIGS. 5A–5C are a detailed flowchart of one embodiment of the measurement invocation method of the present invention. At start block 502 the measurement invocation process 500 begins. At block 504 the system monitors the graphical user interface 116 to determine whether the user has selected a measurement icon 308. This occurs when the measurement invocation system 118 receives an indication from the operating system 114 that the user has made a selection of a pixel location which is located within the measurement bar region 304. In a preferred embodiment wherein the pointing device is a mouse, this would occur when the user depresses the assigned mouse button while the cursor 316 is positioned over the measurement bar region 304. As noted, in FIG. 3A, the cursor 316 is dwelling over the rise-time measurement icon 308A in measurement toolbar region 304.

At block 506 the selected measurement is determined. The measurement invocation system 118 determines the specific icon button 308 on the measurement tool bar 304 using measurement bar specification information including pixel geometry of the measurement toolbar 304. From the button number, the icon identifier (IconID) is determined based upon information regarding which measurement icons 308 are currently displayed on the graphical user interface 116. In addition, a measurement identification (MeasID) that corresponds to the measurement depicted in each icon button is associated with the appropriate measurement button. In the exemplary measurement invocation sequence illustrated in FIGS. 3A–3F, the button position is 1 as the rise-time measurement icon 308A is at the top of the column of measurement icons 308 in the measurement toolbar region 304. Since this is the first pane of measurement icons as shown by the button 312, then measurement toolbar manager 202 determines that the currently displayed measurement icon at this button location is the rise-time measurement icon 308A.

At block 508 the selected measurement icon 308 is drawn in a manner representing a depressed button during the time the user maintains the selection of the icon active (that is, while the user holds the mouse button in a depressed position). During the time the user is likely dragging the cursor across the waveform display region 302, shown at block 510. Referring to FIG. 3B, the rise-time measurement icon 308A is being dragged across the waveform display region 302 with cursor 316. The measurement icon 308A located in the measurement toolbar region 304 is shown in a depressed position, indicating that the measurement is in the process of being associated with a source waveform 306.

At decision block 512 it is determined whether the cursor is positioned adjacent to a source waveform 306. As noted, this is determined through the implementation of a hit-test process. The hit-tester rapidly converts the current cursor location to information regarding the nearest source waveform 306. Decision block 512 is performed each time the user moves the mouse while the button depressed. The hit testing process indicates if the current mouse position is 'near' (within a specified radius of, e.g. 25 pixel locations in any direction) a valid measurement source, and if so, the identify of the source waveform. This information is obtained from the scope interface hardware 124 described above.

If the mouse is near a valid source waveform 306, the measurement bitmap is colored in that waveform's color at block 518. The altering of the rendering of the measurement icon 308 is preferred in that it provides a visually simple indication to the user that the measurement icon 308 is sufficiently close to a particular source waveform 306 for the measurement to be invoked. At block 520 a message indicating that the measurement icon 308 may be 'dropped' (i.e. the mouse button may be released) is displayed. Such a message may state, for example, to "release the mouse button here to measure __" with the name of the adjacent waveform provided in the blank. This message supplements the visual feedback to quickly and easily identify when the measurement icon 308 is sufficiently adjacent or over a source waveform 306 while also providing instructions as to what actions are to be taken to advance to the next step of the measurement invocation process provided by the present invention.

Referring to FIG. 3B, the information region 314 includes an indication to "Drag measurement icon to an active source" informing the user that the rise-time measurement icon 308A is not close enough to a source waveform to be performed. Referring to FIG. 3C, the rise-time measurement icon 308A is dwelling over the channel 1 waveform 306A. Here, the icon 308A is rendered with a border in the same color as the channel 1 waveform. In addition, the bitmap representation within the measurement icon 308A representing the corresponding rise-time measurement function is also rendered in the color of the selected channel 1 waveform 306A. Also, the information region 314 indicates that the user may "Release mouse button here to measure Channel 1."

If the cursor is not adjacent to a waveform then the measurement icon is drawn colored in a generic source color at block 514 and a message is displayed at block 516 informing the user that the measurement icon 308 must be dragged to a source waveform 306 for the measurement to be performed. The drag message informs the user to drag the measurement to an active waveform source.

After the determination regarding the selection of the measurement has been completed, then processing continues at decision block 522 whereat it is determined whether the mouse button has been released. If not, then the message indicating that the user is to continue to drag the cursor across the waveform display region 302 remains displayed on the graphical user interface 116 and the above process is repeated.

If the mouse button has been released, then processing at block 524 is performed to determine whether a source waveform 306 has been selected. If the cursor is not near a source waveform 306, then processing continues at decision block 526 to determine if the cursor is over the same measurement icon 308 as when the mouse button was depressed. Here, if the user has just clicked (depressed and released) the mouse button without dragging the measurement icon off of the measurement bar region 304, then the associated measurement may be selected depending upon the determination made at block 532 discussed below.

If at block 526 it is determined that the cursor is not over the same measurement icon, then the icon is drawn "up" or released position at block 528 to represent a mouse button release and the measurement is no longer capable of being dragged to a source waveform without having to repeat the above selection process. The measurement is then canceled at block 530. This occurs when the user clicked on a measurement icon 308, but either un-clicked somewhere that was not over the same measurement icon 308 nor near a source waveform 306.

If at block 526 it is determined that the cursor is over the same measurement icon, then at decision block 532 it is determined whether any valid waveform source 306 is currently active. Here, a determination is made as to whether any source waveforms are active on which this measurement may be performed. This determination is made based upon the contents of the measurement attribute table 208 introduced above.

The selected measurement function will be applied automatically to a default region of a valid displayed waveform if that waveform is the only waveform displayed in the waveform display region 302. If there are no source waveforms 306 active, then processing continues at block 534 whereat a message indicating that the measurement is not possible is displayed on the graphical user interface. This is followed by the rendering of the icon in its released state at block 528 and the cancellation of the measurement at block 530. Processing ceases at end block 558.

If there are source waveforms 306 active, then at block 538 a determination is made as to whether there is greater than one active waveform available. If so, then at block 542 an additional information dialog window is opened for requesting the user to enter the additional information. Here, the requested additional information may include, for example, the identification of a second channel waveform that is necessary to perform a two-source measurement. In an alternative embodiment, the measurement icon 308 may be dragged to two source waveforms 306 to carry out the selection of both sources for a two-source measurement.

If at block 524 it is determined that a source waveform 306 is near the cursor position at the time the mouse button is released, then processing continues at block 536. At block 536 a check is made to see that the waveform near the mouse position is a valid source for the associated measurement. If not, an invalid source message is displayed at a block 534, the measurement icon 308 is drawn in the released state at block 528 and measurement is canceled at block 530.

If only one active source waveform 306 is displayed then processing continues at block 540. The processing at block 540 also occurs when at block 536 it is determined that a valid source waveform 306 was selected. In either circumstance, processing at block 540 is performed. Here, it is determined whether additional information is required to perform the desired measurement. If so, the additional information dialog box is opened on the graphical user interface 116 as noted above. However, here, the required additional information may take the form of additional parameters that are required for certain measurements.

For example, to obtain an RMS voltage measurement, the required additional information would be whether AC RMS or DC RMS measurements are to be performed. Another example is the additional parameter referred to as "area." The additional parameter identifies if the area to be measured is that of a single cycle of the waveform or of the entire waveform, for certain measurements, if the user may not select or provide the additional information, then default selections are made by the present invention. For example, if the measurement is to be performed on a particular region of the source waveform and the user does not provide such information, then the measurement will be performed on the leftmost pulse of the source waveform 306. Other default parameters may be used.

Preferably, the request for additional information is in the form of a pop-up dialog box as described above with reference to FIGS. 3F–3H, although other means for notifying the user of the need for such information is considered to be within the scope of the present invention. However, since this is information that is required for the measurement to be performed, then, in the dialog box embodiment, the user must enter in the required information and close the dialog box for processing to proceed.

Once the measurement and source waveform 306 have been identified and all of the information required to perform the desired measurement has been obtained, then processing continues at block 544. Processing will also continue at block 544 when a single valid waveform is active (538) and there is no additional information (540) required to perform the measurement.

At block 544 it is determined whether a particular characteristic of interest of the selected source waveform 306 is required to be calculated by the waveform analyzer 138. In particular, at block 544 it is determined whether the measurement is edge sensitive. Although many measurements are edge-sensitive, it is noted that not all measurements that may be performed on the source waveform are edge sensitive. For example, the V-Min, V-Max, V-Peak-to-Peak and V-Amplitude, measurements are applied to the entire displayed waveform. Also, V-upper, V-middle and V-lower, as well as T-min and T-max are not edge sensitive.

If the measurement is edge sensitive, then processing continues at block 546 whereat the edge of the waveform nearest the drop point is located using a software search of the acquisition data. Once the nearest edge to the drop point is determined, then the waveform analyzer 138 searches to the left and right of the source waveform 306 to obtain the nearest edge in each direction to arrive at three edges that are to be used in the measurement.

It is understood, however, that the present invention may be implemented in any signal measurement system now or later developed. Accordingly, there may be waveforms for which the horizontal extent is selected based on criteria other than the occurrence of a waveforms edge. For example, in a system wherein the displayed waveforms have many small peaks with shallow valleys between them such that between the peaks there were no edges such as Fast Fourier Transform (FFT) waveform that may be displayed on a spectrum analyzer. Here, the measurements may be used upon the occurrence of peaks, or extrema, of the waveform, rather than edges.

At block 548 the measurement is performed and the result are displayed at block 554. At block 550, a determination is made as to whether the source waveform 306 is to be annotated with an indication that the measurement is being performed at that location. Here, a graphic symbol is displayed on the waveform 306 to indicate the extent and a similar graphic is placed on a results display region 310 to correlate the location of the measurement on the source waveform 306 with the numeric results of that measurement.

In the illustrative embodiment, a total of four measurements may be simultaneously displayed. Accordingly, in one embodiment, the annotations consist of a cycling series of four geometric shapes that provide for recognizable correspondence between a measurement result and the portion of the source waveform 306 to which that measurement applies. In this embodiment, geometric shapes are chosen rather than numbers or letters because the latter elements are used in other aspects of the measurement system and for that reason could present an ambiguous message to the user. In addition, the shapes are preferably rendered in a color that is different than the other display elements.

The annotations are place directly over the waveform portion, such as an edge, to clearly indicate the waveform being measured. For period measurements, the placement of the measurement icon is considered to be the first edge of the period. The portion of the waveform extending over the next two edges to encompass a complete period is that portion of the waveform that is measured. In an alternative embodiment, the placement of the measurement icon may be on the middle edge of the period to be measured. In this embodiment, the search would be performed to advance left and right to the next edge, respectively, to obtain a complete waveform period.

In alterative embodiments, an indication of the measured extent may be displayed in some other well-known manner. For example, a spanning line with an end point and a start point that would either follow along the waveform or a simple horizontal line below the waveform may be provided.

Referring to FIG. 3D, the rise-time measurement of the edge identified by the diamond 318 is measured, the results of which are provided on the transparent display region 310. The results of the measurement contain the text of the measurement that is being performed ("Rise time") and the source waveform with the diamond annotation assigned to this measurement ("(1♦)")and the numeric results. FIG. 3E illustrates the same graphical user interface after four measurements have been invoked by the user. Here, three measurements are being performed on Channel 1 waveform 306A while one of the measurements is being performed on the Channel 2 waveform 306B. The measurements results region 301 contains the results of the four measurements along with the geometric annotations which also appear on the respective location of the measured source waveform 306.

Figure 6:
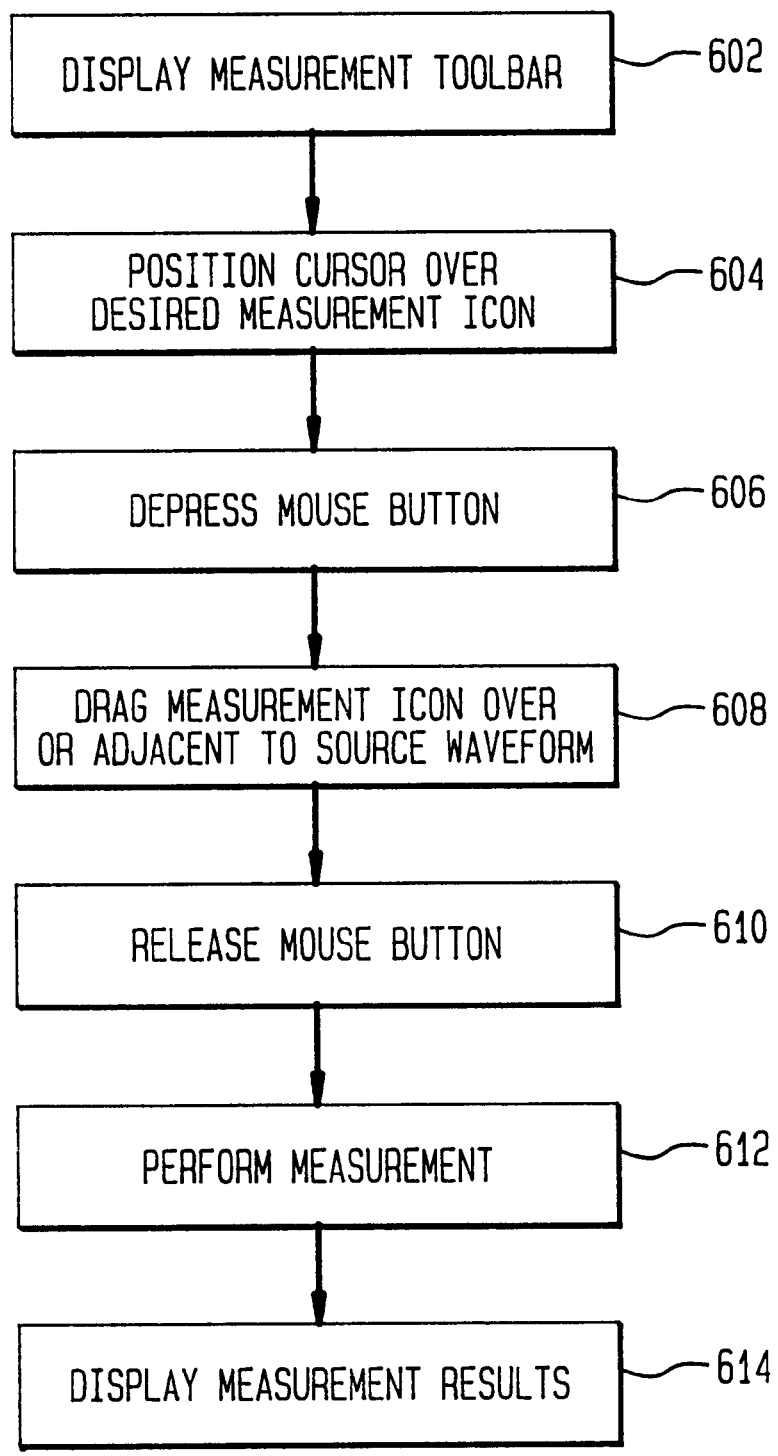
FIG. 6 is a flowchart of one embodiment of the measurement invocation process performed by a user of an implementing signal measurement system.

A method for invoking waveform measurements in a graphical user interface of a signal measurement system is shown in FIG. 6. At block 602 a measurement toolbar 304 consisting of a series of graphical buttons 308 is displayed on the graphical user interface 300. Each graphical button 308 includes a bitmap pictorially representing a corresponding measurement.

At block 604 the user positions the cursor over the appropriate graphical button 308, and depresses the mouse button at block 606. At block 608 the user drags (moves the mouse while the button is down) the measurement icon 308 over or adjacent to a specific region of a source waveform 306. At block 610 the user releases the mouse button to 'drop' the measurement 'on' the selected source waveform 306.

At block 612 the measurement is performed on the selected source waveform 306. This includes requesting additional information, if necessary, including specification of the desired horizontal extent when the measurement applies to only a portion of the source waveform 306.

At block 614 the results of the measurement are displayed on the graphical user interface. This preferably includes the annotation of the source waveform and the associated measurement for ease of association by the user. Throughout the invocation process 600, text instructions preferably appear on the graphical user interface to guide the user.

While various embodiments of the present invention have been described above, it should be understood that they have been presented by way of example only, and not limitation. For example, as noted, it is preferable that the measurement toolbar manager 202 maintains an internal data structure containing the measurement icon ID and associated measurement function ID, both of which are associated with the pixel location geometry of the measurement toolbar region 304. This data structure may be maintained in local memory, may be embodied in software and compiled with the software in which the measurement toolbar manager 202 is embodied, or may be provided in a table store in local memory. However, as one skilled in the art would find apparent, in alternative embodiments, the contents of this data structure may be included in the measurement attribute table 208 and accessed by the measurement toolbar manager 202 in a manner similar to the measurement controller 206.

In the preferred embodiments described above the user controlled the cursor and selected display elements through the user of a well-known mouse pointing device. However, it is understood that the user may select a pixel location through well-known pointing devices introduced above, such as a mouse, trackball, track-pad, joy stick, keyboard, etc. without deviating from the scope of the present invention. These include trackball, trackpad, keyboard, and other cursor control devices, as well as switched and buttons integral with such switches or assigned through software.

In the above embodiments, the measurement toolbar region 304 is positioned adjacent to the waveform display region 302. However, as one skilled in the art would find apparent, the measurement icons 308 may be presented in any manner on the graphical user interface 116. These variations include displaying then within pop-up windows when a menu selection is made and dialog boxes that are transparent and appear over the waveform display region. Other variations are considered to be with in the scope of the present invention. Thus, the breadth and scope of the present invention should not be limited by any of the above-described exemplary embodiments, but should be defined only in accordance with the following claims and their equivalents.

Other features of the present invention may be disclosed in U.S. Pat. No. 5,953,009 entitled GRAPHICAL SYSTEM AND METHOD FOR INVOKING MEASUREMENTS IN A SIGNAL MEASUREMENT SYSTEM, filed May 27, 1997 and naming as inventor Jay A. Alexander, the specification of which is hereby incorporated by reference in its entirety.

What is claimed is:

1. A waveform measurement invocation system for use in a signal measurement system having a graphical user interface, said waveform measurement invocation system configured to provide graphical control elements on the graphical user interface, each of said graphical control elements representing a specific measurement function, wherein graphically associating a graphical control element with a selected displayed waveform invokes said specific measurement function on the selected displayed waveform, wherein said graphical association is achieved by a user selecting and dragging said icon across said graphical user interface, and subsequently releasing said icon at a position proximate to a displayed waveform.

2. The waveform measurement invocation system of claim 1, wherein said graphical association results in the subsequent display of measurement results on the graphical user interface.

3. A system for graphically invoking measurement functions in a signal measurement system having a graphical user interface, comprising:

a measurement toolbar manager constructed and arranged to display a plurality of measurement icons each associated with a signal measurement function;

a waveform identifier constructed and arranged to enable the user to graphically associate a selected measurement icon selected from said plurality of measurement icons with a source waveform displayed on a waveform display region of the graphical user interface by positioning said measurement icon proximate to said source waveform on the graphical interface; and a measurement controller constructed and arranged to invoke, in response to said graphical association, said selected measurement function on a measurement extent of said source waveform.

4. The system of claim 3, wherein said measurement controller is further constructed and arranged to validate said association of said selected measurement and said source waveform prior to invoking said selected measurement function on said measurement extent of said source waveform.

5. A graphical system for signal measurement function invocation wherein a descriptive graphical control element representing a signal measurement function is displayed on a graphical user interface of a signal measurement system, wherein said represented measurement function is invoked on a selected displayed waveform in response to a user graphically positioning said graphical control element adjacent to a specific extent of said selected displayed waveform.

6. The graphical system of claim 5, wherein said graphical positioning is performed in response to a user selecting and dragging said graphical control element from a first position on said graphical user interface to a second position proximate to said selected waveform and subsequently deselecting said graphical control element.

7. The graphical system of claim 5, wherein said graphical association is performed in response to a user graphically selecting said graphical control element followed by the user graphically selecting said selected waveform.

8. The graphical system of claim 5, wherein each said graphical control element comprises:

a bitmap that provides a pictorial description of said corresponding waveform measurement function.

9. A method for invoking waveform measurements in a signal measurement system having a graphical user interface, comprising the steps of:

(a) determining which of one or more measurement icons rendered on said graphical user interface has been selected by the user;

(b) enabling the user to reposition said selected measurement icon from an original position to a new position adjacent to one of one or more waveforms displayed on said graphical user interface;

(c) determining which of one or more waveforms rendered on said graphical user interface has been selected by the user;

(d) performing a measurement operation associated with said selected measurement icon on a measurement extent of said selected source waveform; and (e) displaying results of said measurement operation on said graphical user interface.

10. The method of claim 9, further comprising the steps of:

(f) determining, prior to said step (d), a validity of said association of said selected measurement operation and said selected waveform.

11. A measurement invocation system for automatically performing a waveform measurement function when a measurement icon representing the waveform measurement function is graphically adjacent to a waveform displayed in a waveform display region of a graphical user interface operatively coupled to the measurement indication system, the invocation system comprising:

a measurement toolbar manager configured to display on a graphical user interface one or more measurement icons each corresponding to a waveform measurement function, and to a identify which of said one or more measurement icons has been selected by the user;

a waveform identifier configured to enable the user to graphically reposition said selected measurement icon from a first position to a second position adjacent to a source waveform and to determine a region of measurement invocation on the source waveform; and a measurement controller configured to invoke said selected measurement function on a measurement extent of said source waveform.

12. The system of claim 11, wherein said measurement toolbar manager is further constructed and arranged to determine which of one or more measurement functions corresponds to each said one or more measurement icons.

13. The system of claim 12, wherein said measurement toolbar manager is further constructed and arranged to determine which of said one or more measurement icons the cursor is dwelling over on the graphical user interface.

14. The system of claim 11, wherein said one or more measurement icons are arranged within a measurement toolbar region adjacent to the waveform display region of the graphical user interface.

15. The system of claim 14, wherein said measurement toolbar manager further comprises:

means for enabling said selected measurement icon to be performed on said selected waveform.

16. The system of claim 14, wherein each said measurement icon comprises a bitmap that provides a pictorial description of said corresponding waveform measurement function.

17. The graphical system of claim 5, wherein said graphical control element comprises a measurement icon.

18. The graphical system of claim 17, wherein a plurality of descriptive measurement icons are displayed on the graphical user interface, each said plurality of descriptive measurement icons corresponding to a waveform measurement function, wherein said graphical system comprises:

a waveform identifier configured to enable the user to graphically associate a selected measurement icon with a source waveform and for determining a point of measurement invocation on the source waveform; and a measurement controller configured to invoke said selected measurement function on a measurement extent of said source waveform when said association of said selected measurement and said source waveform is a valid association.

19. The graphical system of claim 18, wherein said waveform identifier enables the user to drag said selected measurement icon to different locations on the waveform display region to a position proximate to the source waveform.

* * * * *